United States Patent
Dimitrov et al.

(10) Patent No.: US 8,295,072 B2
(45) Date of Patent: *Oct. 23, 2012

(54) MAGNETIC RANDOM ACCESS MEMORY (MRAM) UTILIZING MAGNETIC FLIP-FLOP STRUCTURES

(75) Inventors: Dimitar V. Dimitrov, Edina, MN (US); Olle Gunnar Heinonen, Eden Prairie, MN (US); Yiran Chen, Eden Prairie, MN (US); Haiwen Xi, Prior Lake, MN (US); Xiaohua Lou, Bloomington, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/074,384

(22) Filed: Mar. 29, 2011

(65) Prior Publication Data

US 2011/0176360 A1 Jul. 21, 2011

Related U.S. Application Data

(63) Continuation of application No. 12/415,257, filed on Mar. 31, 2009, now Pat. No. 7,933,137.

(60) Provisional application No. 61/103,761, filed on Oct. 8, 2008.

(51) Int. Cl.
*G11C 17/06* (2006.01)
(52) U.S. Cl. ......... 365/105; 365/115; 365/171; 365/243
(58) Field of Classification Search .................. 365/105, 365/115, 171, 243
See application file for complete search history.

(56) References Cited

U.S. PATENT DOCUMENTS

| | | | |
|---|---|---|---|
| 5,640,343 A | 6/1997 | Gallagher |
| 5,695,864 A | 12/1997 | Slonczewski |
| 5,734,605 A | 3/1998 | Zhu |
| 5,991,193 A | 11/1999 | Gallagher |
| 6,130,835 A | 10/2000 | Scheuerlein |
| 6,169,686 B1 | 1/2001 | Brug |
| 6,256,223 B1 | 7/2001 | Sun |
| 6,331,944 B1 | 12/2001 | Monsma |
| 6,385,082 B1 | 5/2002 | Abraham |

(Continued)

FOREIGN PATENT DOCUMENTS

EP  1248265  10/2002

(Continued)

OTHER PUBLICATIONS

Agilent 81140A Series 81141A/81142A Serial Pulse Data Generators 7GHz and 13.5GHz, Data Sheet, Version 1.1. Oct. 6, 2005.

(Continued)

*Primary Examiner* — Pho M Luu
(74) *Attorney, Agent, or Firm* — Mueting Raasch & Gebhardt PA

(57) ABSTRACT

Non-volatile magnetic random access memory (MRAM) devices that include magnetic flip-flop structures that include a magnetization controlling structure; a first tunnel barrier structure; and a magnetization controllable structure that includes a first polarizing layer; and a first stabilizing layer, wherein the first tunnel barrier structure is between the magnetization controllable structure and the magnetization controlling structure and the first polarizing layer is between the first stabilizing layer and the first tunnel barrier structure, wherein the magnetic flip-flop device has two stable overall magnetic; configurations a second tunnel barrier structure and a reference layer, wherein the second tunnel barrier structure is between the magnetic flip-flop device and the reference layer.

22 Claims, 12 Drawing Sheets

U.S. PATENT DOCUMENTS

| | | | |
|---|---|---|---|
| 6,597,618 B2* | 7/2003 | Zheng et al. | 365/225.5 |
| 6,714,444 B2 | 3/2004 | Huai | |
| 6,798,689 B2 | 9/2004 | Muller | |
| 6,925,000 B2 | 8/2005 | Sussner | |
| 7,009,877 B1 | 3/2006 | Huai | |
| 7,031,178 B2 | 4/2006 | Parkin | |
| 7,098,494 B2 | 8/2006 | Pakala | |
| 7,154,771 B2* | 12/2006 | Braun | 365/158 |
| 7,187,577 B1 | 3/2007 | Wang | |
| 7,218,550 B2 | 5/2007 | Schwabe | |
| 7,224,601 B2 | 5/2007 | Panchula | |
| 7,230,844 B2 | 6/2007 | Deak | |
| 7,272,034 B1 | 9/2007 | Chen | |
| 7,282,755 B2 | 10/2007 | Pakala | |
| 7,286,395 B2 | 10/2007 | Chen | |
| 7,289,356 B2 | 10/2007 | Diao | |
| 7,345,912 B2 | 3/2008 | Luo | |
| 7,369,427 B2 | 5/2008 | Diao | |
| 7,376,004 B2* | 5/2008 | Eaton et al. | 365/158 |
| 7,379,327 B2 | 5/2008 | Chen | |
| 7,394,684 B2 | 7/2008 | Inokuchi | |
| 7,489,541 B2 | 2/2009 | Pakala | |
| 7,502,249 B1 | 3/2009 | Ding | |
| 7,515,457 B2 | 4/2009 | Chen | |
| 7,596,015 B2 | 9/2009 | Kitagawa | |
| 7,688,616 B2* | 3/2010 | Wang et al. | 365/158 |
| 7,768,824 B2 | 8/2010 | Yoshikawa | |
| 7,933,137 B2* | 4/2011 | Dimitrov et al. | 365/105 |
| 2002/0136047 A1 | 9/2002 | Scheuerlein | |
| 2002/0186582 A1 | 12/2002 | Sharma | |
| 2003/0007398 A1 | 1/2003 | Daughton | |
| 2003/0168684 A1 | 9/2003 | Pan | |
| 2004/0061154 A1 | 4/2004 | Huai | |
| 2006/0018057 A1 | 1/2006 | Huai | |
| 2006/0209600 A1 | 9/2006 | Le Phan | |
| 2007/0085068 A1 | 4/2007 | Apalkov | |
| 2007/0096229 A1 | 5/2007 | Yoshikawa | |
| 2007/0105241 A1 | 5/2007 | Leuschner | |
| 2007/0246787 A1 | 10/2007 | Wang | |
| 2007/0297220 A1 | 12/2007 | Yoshikawa | |
| 2008/0117553 A1 | 5/2008 | Carey | |
| 2008/0144355 A1 | 6/2008 | Boeve | |
| 2008/0164547 A1 | 7/2008 | Higo | |
| 2008/0197431 A1 | 8/2008 | Morise | |
| 2008/0205125 A1 | 8/2008 | Kajiyama | |
| 2008/0225583 A1 | 9/2008 | Guo | |
| 2008/0258247 A1 | 10/2008 | Mancoff | |
| 2008/0273380 A1 | 11/2008 | Diao | |
| 2008/0310213 A1 | 12/2008 | Chen | |
| 2008/0310214 A1 | 12/2008 | Wang | |
| 2008/0310219 A1 | 12/2008 | Chen | |
| 2009/0015958 A1 | 1/2009 | Nakamura | |
| 2009/0027810 A1 | 1/2009 | Horng | |
| 2009/0040855 A1 | 2/2009 | Luo | |
| 2009/0050991 A1 | 2/2009 | Nagai | |
| 2009/0185410 A1 | 7/2009 | Huai | |
| 2009/0302403 A1 | 12/2009 | Nguyen | |
| 2010/0007344 A1 | 1/2010 | Guao | |

FOREIGN PATENT DOCUMENTS

| | | |
|---|---|---|
| EP | 1296331 | 3/2003 |
| EP | 1321943 | 6/2003 |

OTHER PUBLICATIONS

Akerman, Toward a Universal Memory, Science, vol. 308, Apr. 22, 2005.

Kawahara et al., Spin-Transfer Torque RAM (SPRAM) with Bit-by-Bit Bidirectional Current Write and Parallelizing-Direction Current Read, ISSCC 07, San Francisco, Feb. 25, 2007.

LeClair et al., Sign Reversal of Spin Polarization in Co/Ru/Al$_2$O$_3$/Co Magnetic Tunnel Junctions, Physical Review B, vol. 64, 100406(R), Aug. 22, 2001.

Li, et al., Bias Dependence and Inversion of the Tunneling Magnetoresistance in Ferromagnetic Junctions, Physical Review B 69, 054410 (2004), Feb. 17, 2004.

Ozatay et al., Spin Transfer by Nonuniform Current Injection Into a Nanomagnet, Applied Physics Letters 88, 202502 (2006), May 18, 2006.

U.S. Appl. No. 12/415,243, filed Mar. 31, 2009, Dimitrov.

U.S. Appl. No. 12/234,929, filed Sep. 22, 2008, Xi.

Sharma et al., Inversion of Spin Polarization and Tunneling Magnetoresistance in Spin-Dependent Tunneling Junctions, Physical Review Letters, vol. 82, No. 3, Jan. 18, 1999.

Slonczewski, J.C., Current-Driven Excitation of Magnetic Multilayers, Journal of Magnetism and Magnetic Materials 159 (1996) L1-L7, Dec. 19, 1995.

U.S. Appl. No. 12/234,929, filed Sep. 22, 2008, Inventors: Xi.

U.S. Appl. No. 12/415,257, filed Mar. 31, 2009; Inventors: Dimitrov.

Valenzuela et al., Spin Polarized Tunneling at Finite Bias, Physical Review Letters, PRL 94, 196601 (2005), Jul. 25, 2005.

Waintal, et al., Role of Spin-Dependent Interface Scattering in Generating Current-Induced Torques in Magnetic Multilayers, Phy. Rev. B, vol. 62, 12317 (2000), May 16, 2000.

Yuasa et al., Spin-Polarized Resonant Tunneling in Magnetic Tunnel Junctions, Science 297, 234 (2002). May 6, 1988.

J.C. Slonczweski, PRB, vol. 39, 10, p. 6995 (1989), Oct. 27, 1989.

Hosomi et al., Electron Devices Meeting, 2005, IEDM Technical Digest, IEEE International, pp. 459-462, May 16, 2005.

H. (N) or (H)umata, T. Suzuki, N. Ohshima, S. Fukami, K. Nagahara, N. Ishiwata, and N. Kasai, Scalable Cell Technology Utilizing Domain Wall Motion for High Speed MRAM, T12B-4, Symposium on VLSI Technology, Japan 2007, Dec. 31, 2007.

J.C. Sun et al., APL 90, 121128 (2007), Mar. 23, 2007.

Myoung, Jae Lee et al., In 2 Stack 1D-1R Cross Point Structure with Oxide Diodes as Switch Elements in High Density Resistance RAM Applications, IEDM 2007, Apr. 27, 2009.

M. Nakayama et al., JAP 103, 07A710 (2008). Feb. 13, 2008.

* cited by examiner

MAGNETIC RANDOM ACCESS MEMORY (MRAM) UTILIZING MAGNETIC FLIP-FLOP STRUCTURES

PRIORITY

This application is a continuation of U.S. application Ser. No. 12/415,257 filed Mar. 31, 2009, now U.S. Pat. No. 7,933,137 issued on Apr. 26, 2011, which claims priority to U.S. Provisional Application No. 61/103,761, entitled "STACKABLE 3D SPIN MOMENTUM TRANSFER DRIVEN FAST NONVOLATILE MEMORY" filed on Oct. 8, 2008, the disclosures of which are incorporated herein by reference.

BACKGROUND

Spintronics is an area of technology that utilizes the spin of electrons to manipulate various properties of a device, such as magnetic state or resistance for example. Much of the technology is based on the phenomena called spin momentum transfer effect or spin torque transfer effect. Spin torque transfer effect refers to the effect of a spin-polarized current when it interacts with the local magnetization of a magnetic layer. There is significant interest in using memory devices with unipolar switching that can be implemented in three dimensional stacked packages.

BRIEF SUMMARY

Disclosed are non-volatile magnetic random access memory (MRAM) devices that include magnetic flip-flop structures, a tunnel junction and a reference layer.

Disclosed are MRAM devices that include a) a magnetic flip-flop structure that includes: i. a magnetization controlling structure; ii. a first tunnel barrier structure; and iii. a magnetization controllable structure that includes a first polarizing layer; and a first stabilizing layer, wherein the first tunnel barrier structure is between the magnetization controllable structure and the magnetization controlling structure and the first polarizing layer is between the first stabilizing layer and the first tunnel barrier structure, wherein the electronic device has two stable overall magnetic configurations, and wherein a first unipolar current applied to the electronic device will cause the orientation of the magnetization controlling structure to reverse its orientation and a second unipolar current applied to the electronic device will cause the magnetization controllable structure to switch its magnetization so that the device reaches one of the two stable overall magnetic configurations, wherein the second unipolar current has an amplitude that is less than the first unipolar current; b) a second tunnel barrier structure; and c) a reference layer, wherein the second tunnel barrier structure is between the magnetic flip-flop structure and the reference layer.

Disclosed are MRAM cells that include a MRAM device that includes a) a magnetic flip-flop structure that includes: i. a magnetization controlling structure; ii. a first tunnel barrier structure; and iii. a magnetization controllable structure that includes a first polarizing layer; and a first stabilizing layer, wherein the first tunnel barrier structure is between the magnetization controlling structure and the magnetization controllable structure and the first polarizing layer is between the first stabilizing layer and the first tunnel barrier structure, wherein the electronic device has two stable overall magnetic configurations, and wherein a first unipolar current applied to the electronic device will cause the orientation of the magnetization controlling structure to reverse its orientation and a second unipolar current applied to the electronic device will cause the magnetization controllable structure to switch its magnetization so that the device reaches one of the two stable overall magnetic configurations, wherein the second unipolar current has an amplitude that is less than the first unipolar current; b) a second tunnel barrier structure; and c) a reference layer, wherein the second tunnel barrier structure is between the magnetic flip-flop structure and the reference layer; and a diode, wherein the diode is electrically coupled to the MRAM device to control current flow.

Disclosed are methods of accessing a memory array that includes the steps of providing an array of unipolar MRAM cells, each cell serially connected to a diode, configured in rows and columns with row conductors and column conductors; setting all row conductors to a high potential and setting all column conductors to a low potential; accessing a desired MRAM cell by setting a corresponding desired column conductor to a high potential and setting a corresponding desired row conductor to a low potential; and passing a unipolar current to the desired MRAM cell.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Embodiments other than those specifically discussed herein are contemplated and may be made without departing from the scope or spirit of the present disclosure. The following detailed description is not limiting. The definitions provided are to facilitate understanding of certain terms frequently used and do not limit the disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g., 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification, use of a singular form of a term, can encompass embodiments including more than one of such term, unless the content clearly dictates otherwise. For example, the phrase "adding a solvent" encompasses adding one solvent, or more than one solvent, unless the content clearly dictates otherwise. As used in this specification and the appended claims, the term "or" is generally employed in its sense including "either or both" unless the context clearly dictates otherwise.

"Include," "including," or like terms means encompassing but not limited to, that is, including and not exclusive.

Disclosed are magnetic random access memory (MRAM) devices and cells that utilize the spin torque transfer effect to switch between two magnetic states. The device advantageously utilizes unipolar current to affect the switch.

Figure 1A:
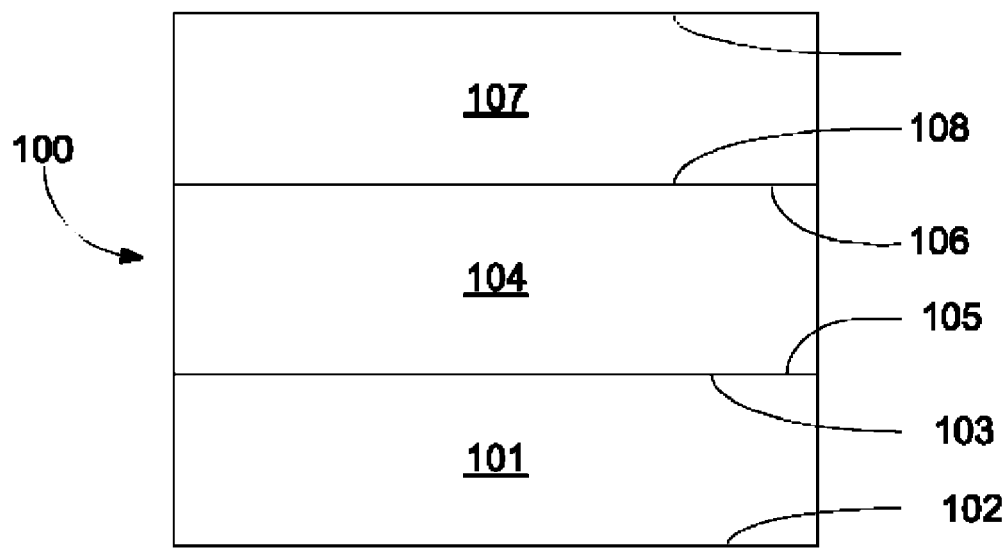
FIGS. 1A and 1B are schematic representations of exemplary disclosed magnetic random access memory (MRAM) devices.

FIG. 1A illustrates an embodiment of a disclosed MRAM device 100 that includes a reference layer 101, a tunnel barrier structure 104 (the tunnel barrier structure can also be referred to as a tunnel junction and can be referred to as a second tunnel barrier structure) and a magnetic flip-flop structure 107. The reference layer 101 has a first surface 102 and a second surface 103. A structure, as that term is used herein can, but need not include more than one layer or one or more than one material. In embodiments, a structure (e.g. a magnetic flip-flop structure 107) can include multiple layers of multiple materials. In embodiments, a "layer" can refer to a single layer of a single material, in embodiments, a "layer" can refer to multiple layers of a single material and in embodiments a "layer" can refer to multiple layers of multiple materials.

The tunnel junction 104 has a first surface 105 and a second surface 106. The magnetic flip-flop structure 107 has a first surface and a second surface. In embodiments, the second surface 103 of the reference layer 101 can be adjacent to, directly adjacent to, or in contact with the first surface 105 of the tunnel junction 104 (similarly, the first surface 105 of the tunnel junction 104 can be adjacent to, directly adjacent to, or in contact with the second surface 103 of the reference layer 101). In embodiments, the second surface 106 of the tunnel junction 104 can be adjacent to, directly adjacent to, or in contact with the first surface 108 of the magnetic flip-flop device 107 (similarly, the first surface 108 of the magnetic flip-flop device 107 can be adjacent to, directly adjacent to, or in contact with the second surface 106 of the tunnel junction). In embodiments, the tunnel barrier structure 104 can be positioned between the reference layer 101 and the magnetic flip-flop structure 107.

The reference layer 101 is a magnetic material that is "pinned". A pinned magnetic layer has a magnetic orientation that is not changed during normal operation of the device in which it is included. In embodiments, the reference layer 101 can be a single magnetic layer stabilized with intrinsic or shape anisotropy, a single magnetic layer stabilized with an antiferromagnetic (AFM) layer, a synthetic antiferromagnet stabilized with intrinsic or shape anisotropy, or a synthetic antiferromagnet stabilized with an AFM layer. In embodiments, the magnetic layer that can be included in the reference layer 101 can include cobalt (Co), iron (Fe), boron (B), nickel (Ni), manganese (Mn), and alloys thereof for example. In embodiments, the reference layer 101 can include nickel iron (NiFe), cobalt iron (CoFe), cobalt iron boron (CoFeB), or compounds thereof for example. Other ferromagnetic materials can also be utilized. In embodiments, the reference layer 101 can also include synthetic layers (e.g. ferromagnetic layer/spacer layer/ferromagnetic layer).

The tunnel junction 104 is a material that allows electrons to "tunnel" through the layer. The material of the tunnel junction 104 can generally be a non-magnetic material that functions as an electric insulator. Examples of materials that can be utilized as the tunnel junction 104 include oxides or nitrides of aluminum (Al), magnesium (Mg), silicon (Si), hafnium (Hf), strontium (Sr) or titanium (Ti) for example. Specific exemplary materials include $SiO_x$, $SiN_x$, $SiO_xN_y$, $AlO_x$, $TO_x$, $TiO_x$, $AlN_x$, and combinations thereof for example.

Figure 1B:
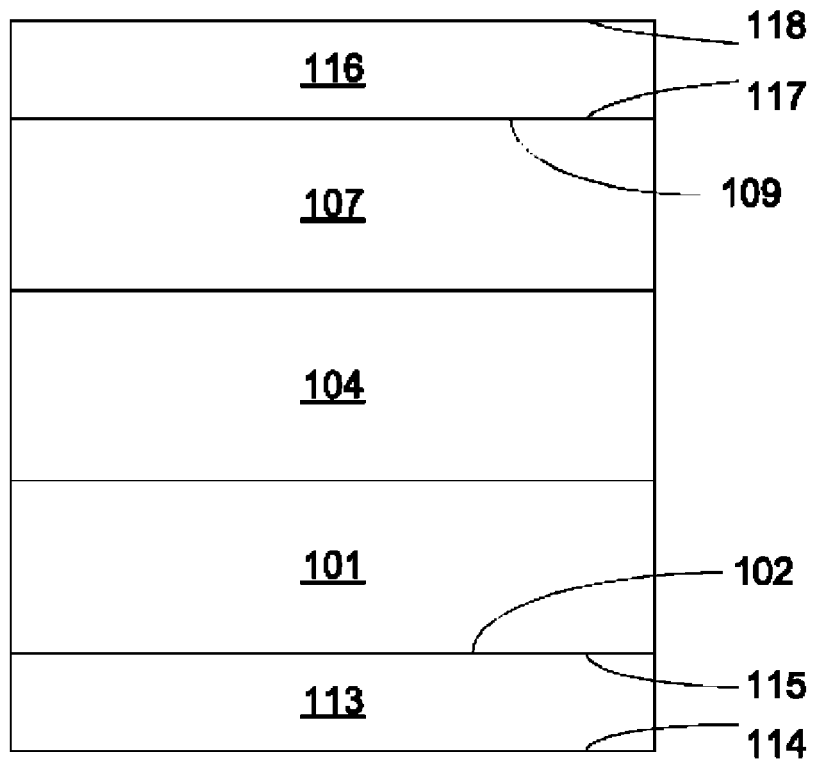

Disclosed MRAM devices can also optionally include additional layers. FIG. 1B demonstrates an exemplary embodiment of a device that includes a reference layer 101, a tunnel junction 104 and a magnetic flip-flop structure 107. This exemplary device can also include a cap layer 116. The cap layer 116 has a first surface 117 and a second surface 118. The first surface 117 of the cap layer 116 can be positioned adjacent to, directly adjacent to or in contact with the second surface 109 of the magnetic flip-flop structure 107 (similarly, the second surface 109 of the magnetic flip-flop structure 107 can be positioned adjacent to, directly adjacent to, or in contact with the first surface 117 of the cap layer 116). A cap layer 116 can generally function to protect the device from environmental conditions. Exemplary materials for cap layer 116 can include tantalum (Ta) or tantalum nitride (TaN) for example. In embodiments a layer of Ta or TaN of about 100 Angstroms (Å) can be utilized as a cap layer 905. Any of the embodiments of devices or cells depicted, described or disclosed herein can optionally include a cap layer.

Another optional layer that can be included in disclosed devices is a seed layer. The exemplary device depicted in FIG. 1B includes a seed layer 113. The seed layer 113 has a first surface 114 and a second surface 115. The second surface 115 of the seed layer 113 can be positioned adjacent to, directly adjacent to or in contact with the first surface 102 of the reference layer 101. A seed layer 113 can generally function to assist the formation and structural stability of the device and specifically the first surface 102 of the reference layer 101. The materials that make up the seed layer 113 can vary and can depend at least in part on the particular components that make up the first surface 102 of the reference layer 101. Any of the embodiments of devices or cells depicted, described or disclosed herein can optionally include a seed layer.

Figure 2A:
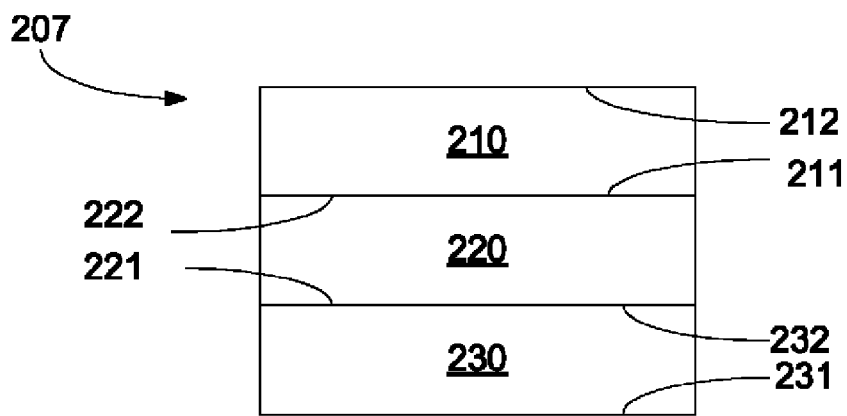
FIG. 2A is a schematic representation of an exemplary flip-flop structure of a disclosed device.

FIG. 2A illustrates an embodiment of a magnetic flip-flop structure 207. An exemplary magnetic flip-flop structure 207 includes a magnetization controlling structure 230 (also referred to simply as a controlling structure 230), a tunnel barrier structure 220, and a magnetization controllable structure 210 (also referred to simply as a controllable structure 210). A structure, as that term is used herein can, but need not include more than one layer. In embodiments, a structure (e.g. a controlling structure 230, a tunnel barrier structure 220 or a controllable structure 210) can include a single layer of a single material, multiple layers of a single material or multiple layers of multiple materials.

The controlling structure 230 has a first surface 231 and a second surface 232. The tunnel barrier structure 220 has a first surface 221 and a second surface 222. The controllable structure 210 has a first surface 211 and a second surface 212. In embodiments, the second surface 232 of the controlling structure 230 can be adjacent to, directly adjacent to, or in contact with the first surface 221 of the tunnel barrier structure 220 (similarly, the first surface 221 of the tunnel barrier structure 220 can be adjacent to, directly adjacent to, or in contact with the second surface 232 of the controlling structure 230). In embodiments, the second surface 222 of the tunnel barrier structure 220 can be adjacent to, directly adjacent to, or in contact with the first surface 211 of the controllable structure 210 (similarly, the first surface 211 of the controllable structure 210 can be adjacent to, directly adjacent to, or in contact with the second surface 222 of the tunnel barrier structure 220). In embodiments, the tunnel barrier structure 220 can be located between the controlling structure 230 and the controllable structure 210. In embodiments, the tunnel barrier structure 220 can be positioned between the controlling structure 230 and the controllable structure 210.

The tunnel barrier structure 220 can generally include a material or materials that can afford a relatively large spin momentum transfer through the structure and are non-magnetic. Exemplary materials include oxide materials such as alumina ($Al_2O_3$), titanium oxides ($TiO_x$), magnesium oxide (MgO), zinc oxide (ZnO), hafnium oxide (HfO), gallium oxide (GaO), and combinations thereof. Other useful materials can also be utilized for the tunnel barrier structure 220. Any useful thickness of the material or materials of the tunnel barrier structure 220 can be utilized. In embodiments, the tunnel barrier structure 220 can have a thickness from about 0.5 nanometers (nm) to about 15 nm depending at least in part on the identity of the material or materials making up the tunnel barrier structure 220.

Figure 2B:
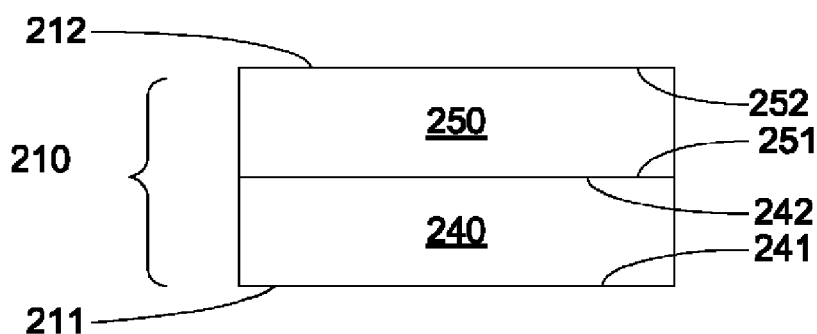
FIG. 2B is a schematic representation of an exemplary controllable structure of a disclosed flip-flop structure.

An embodiment of an exemplary controllable structure is depicted in FIG. 2B. An exemplary controllable structure 210 includes a polarizing layer 240 (also referred to as a first polarizing layer 240) and a stabilizing layer 250 (also referred to as a stabilizing layer 250). In embodiments, a "layer" can refer to a single layer of a single material, and in other embodiments, a "layer" can refer to multiple layers of a single material and in embodiments a "layer" can refer to multiple layers of multiple materials. The polarizing layer 240 has a first surface 241 and a second surface 242. The stabilizing layer 250 has a first surface 251 and a second surface 252. In embodiments, the second surface 242 of the polarizing layer 240 can be adjacent to, directly adjacent to, or in contact with the first surface 251 of the stabilizing layer 250, and similarly, the first surface 251 of the stabilizing layer 250 can be adjacent to, directly adjacent to, or in contact with the second surface 242 of the polarizing layer 240. In embodiments, the first surface 211 of the controllable structure 210 can be substantially composed of the polarizing layer 240. In embodiments, the second surface 212 of the controllable structure 210 can be substantially composed of the stabilizing layer 250. Therefore, in such embodiments, the second surface of the tunnel barrier structure (222 in FIG. 2A) can be adjacent to, directly adjacent to, or in contact with the first surface 241 of the polarizing layer 240 of the controllable structure 210. In embodiments, the polarizing layer 240 can be between the stabilizing layer 250 and the tunnel barrier structure (220 in FIG. 2A).

Embodiments of magnetic flip-flop structures include controlling structures that also include polarizing and stabilizing layers. An example of such a structure 307 can be seen in FIG. 3A. The structure depicted in FIG. 3A includes a controlling structure 330, a tunnel barrier structure 320 and a controllable structure 310. The controllable structure 310 includes the polarizing layer 340 (also referred to as a second polarizing layer 340) and the stabilizing layer 350 (also referred to as a second stabilizing layer 350) as discussed above. The controlling structure 330 in such an exemplary device can include a polarizing layer 360 and a stabilizing layer 370. As in the controllable structure 310, the polarizing layer 360 has a first surface 361 and a second surface 362; and the stabilizing layer 370 has a first surface 371 and a second surface 372. The second surface 362 of the polarizing layer 360 of the controlling structure 330 can be adjacent to, directly adjacent to, or in contact with the first surface (221 in FIG. 2A) of the tunnel barrier structure 320 (or similarly, the first surface of the tunnel barrier structure 320 can be adjacent to, directly adjacent to, or in contact with the second surface 362 of the polarizing layer 360 of the controlling structure 330). The second surface 372 of the stabilizing layer 370 of the controlling structure 330 can be adjacent to, directly adjacent to, or in contact with the first surface 361 of the polarizing layer 360 of the controlling structure 330 (or similarly, the first surface 361 of the polarizing layer 360 of the controlling structure 330 can be adjacent to, directly adjacent to, or in contact with the second surface 372 of the stabilizing layer 370 of the controlling structure 330). In embodiments, the polarizing layer 340 can be between the stabilizing layer 350 and the tunnel barrier structure 320.

The magnetic materials that are included in magnetic flip-flop structures can either have perpendicular to the plane anisotropy and magnetization or in-plane anisotropy and magnetization. In embodiments, some materials can be made to have either perpendicular to the plane or in-plane anisotropy by choosing an appropriate seed layer. For example CoPt can have perpendicular anisotropy if grown on Ru or CrRu but can have in-plane anisotropy if grown on Ti or Ta. As another illustrative example, FePt can have perpendicular anisotropy if grown on Pt but can have in-plane anisotropy if grown on Ru. In embodiments, the anisotropy of some materials cannot be controlled by the choice of seed layers. For example, materials such as amorphous TbFeCo or GdTb-CoFe usually have perpendicular anisotropy and materials such as CoFe, CoNiFe, CoFeB have in-plane anisotropy regardless of the seed layer chosen. Magnetic flip-flop structures that have only magnetic material that is perpendicular to the plane anisotropy and magnetization can be referred to as "perpendicular to the plane anisotropy and magnetization structures" or "perpendicular anisotropy structures". Structures that have only magnetic material that is in-plane anisotropy and magnetization can be referred to as "in-plane anisotropy and magnetization structures" or "in-plane anisotropy structures". Materials that have perpendicular to the plane anisotropy and magnetization have magnetic orientations that are perpendicular to a defined plane of the structure. Materials that have in-plane anisotropy and magnetization have magnetic orientations that are parallel to a defined plane of the structure. FIGS. 3B, 3C, 4A, 4B, 4C and 4D depict structures that have perpendicular to the plane anisotropy and magnetization; and FIGS. 6A, 6B, 7A, 7B, 7C and 7D depict structures that have in-plane anisotropy and magnetization.

A magnetic flip-flop structure that has perpendicular to the plane anisotropy and magnetization will include magnetic materials that only have perpendicular to the plane anisotropy and magnetization. A magnetic flip-flop structure that has in-plane anisotropy and magnetization will include magnetic materials that only have in-plane anisotropy and magnetization. It should be noted that both perpendicular to the plane anisotropy and magnetization structures and an in-plane anisotropy and magnetization structures will also include non-magnetic materials (e.g. tunnel barrier structure and optional seed and cap layers).

Figure 3A:
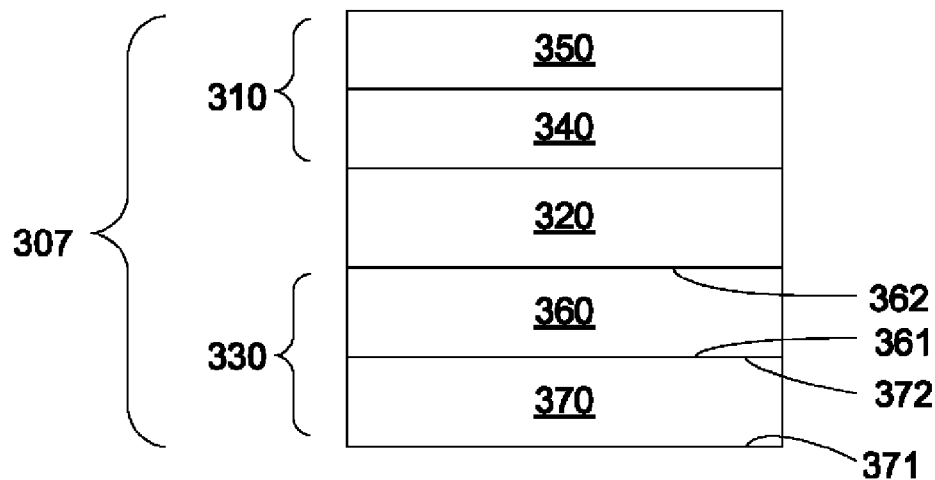
FIG. 3A is a schematic representation of a disclosed flip-flop device with both controlling structures and controllable structures that include polarizing and stabilizing layers respectively.
Figure 3B:
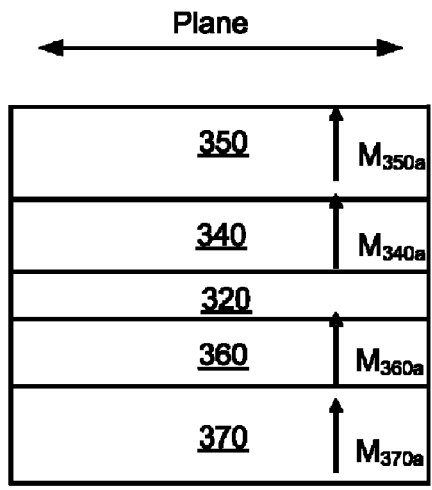
FIGS. 3B and 3C demonstrate the two stable magnetic configurations of the exemplary perpendicular to the plane anisotropy and magnetization flip-flop device depicted in FIG. 3A.
Figure 3C:
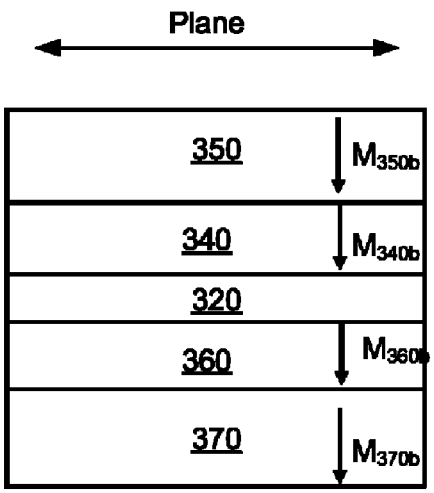

FIGS. 3B and 3C depict the two stable states of an exemplary perpendicular to the plane anisotropy and magnetization structure. The structures depicted in these figures include controlling structures 330, tunnel barrier structures 320 and controllable structures 310 as discussed above. The plane of the structures is depicted by the arrows above the structures. There are two different magnetic configurations, one of which the structure will automatically revert to after a perturbation. The first is shown in FIG. 3B and has all of the magnetic moments of the controlling structure 330 and the controllable structure 310 aligned "up", referred to as the "stable up configuration". This is depicted by the arrows depicting the magnetic moment of the stabilizing layer $M_{370a}$ and the polarizing layer $M_{360a}$ of the controlling structure 330; and the magnetic moment of the polarizing layer $M_{340a}$ and the stabilizing layer $M_{350a}$ of the controllable structure 310. The second stable configuration is shown in FIG. 3C and has all of the magnetic moments of the controlling structure 330 and the controllable structure 310 aligned "down", referred to as the "stable down configuration". This is depicted by the arrows depicting the magnetic moment of the stabilizing layer $M_{370b}$ and the polarizing layer $M_{360b}$ of the controlling structure 330; and the magnetic moment of the polarizing layer $M_{340b}$ and the stabilizing layer $M_{350b}$ of the controllable structure 310.

Figure 4A:
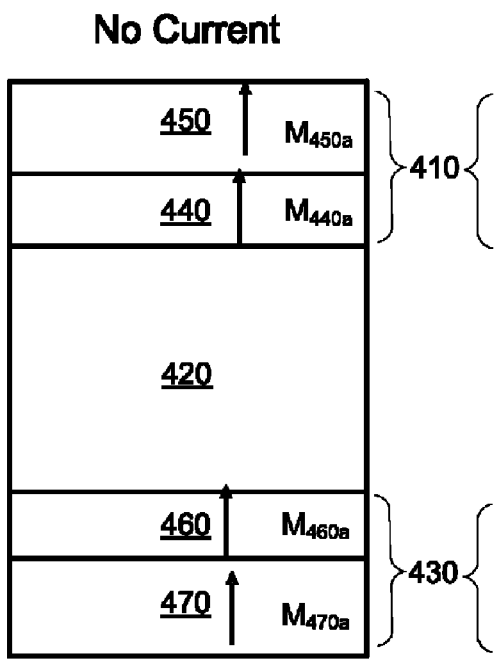
FIG. 4A depicts the exemplary device of FIG. 3A before a first current is applied thereto.

FIGS. 4A, 4B, 4C and 4D illustrate the application of unipolar current to a perpendicular to the plane anisotropy and magnetization structure such as that depicted in FIG. 3A. As seen in FIG. 4A, the structure includes a controlling structure 430 that includes a stabilizing layer 470 and a polarizing layer 460, a tunnel barrier structure 420 (exaggerated for easier visualization) and a controllable structure 410 that includes a polarizing layer 440 and a stabilizing layer 450. For the sake of example, the structure is depicted as being in the stable up configuration, although the same principles apply to the stable down configuration.

Figure 4B:
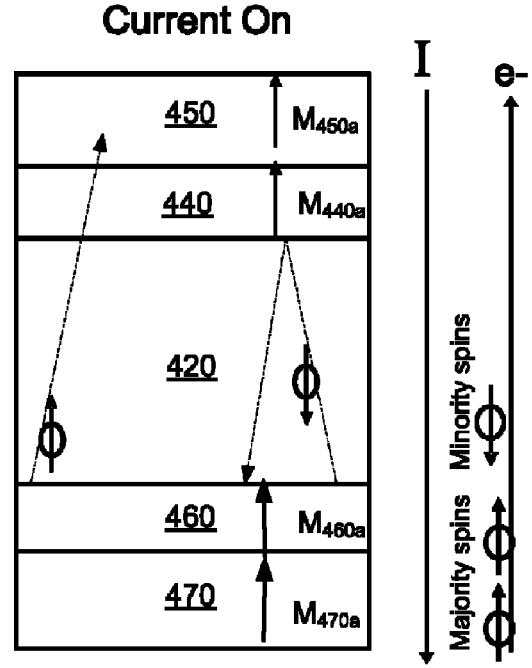
FIGS. 4B and 4C depicts the exemplary device of FIG. 3A while the first current is flowing through the device.
Figures 4C, 4D:
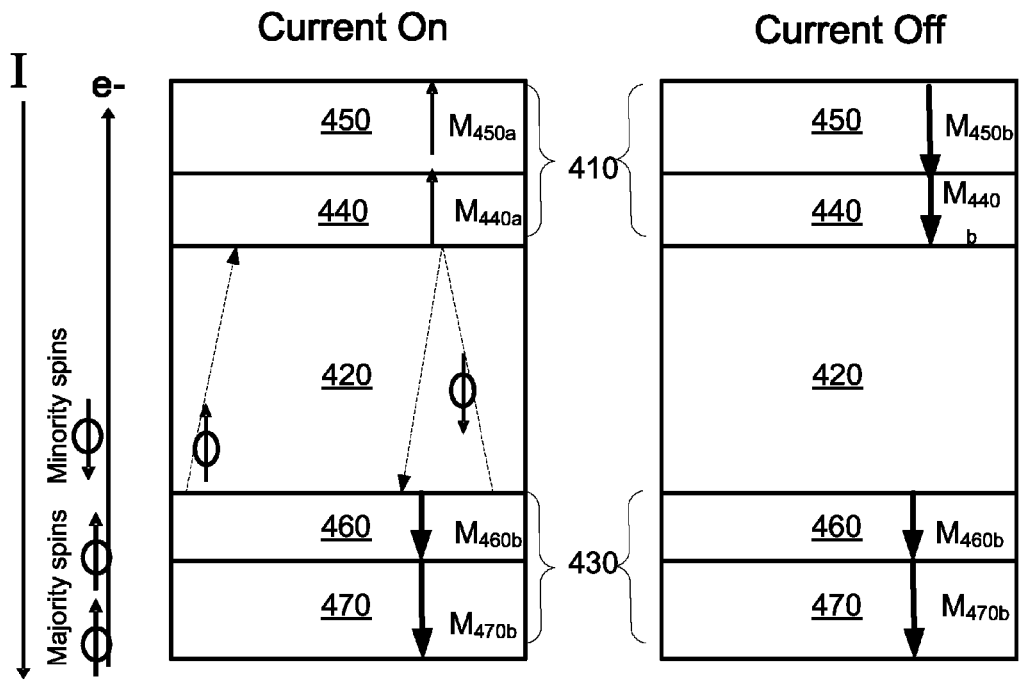
FIG. 4D depicts the exemplary device of FIG. 3A while a second current is applied thereto.

FIG. 4B shows the structure at the instant a first unipolar current is directed from the controllable structure 410 to the controlling structure 430 as depicted by the arrow labeled "I" on the right side of the figure. Applying current from the controllable structure 410 to the controlling structure 430 causes electrons to flow from the controlling structure 430 to the controllable structure 410, as depicted by the arrow labeled "e⁻" on the right side of the figure. As with all electrical current, some of the electrons will emerge from the polarizing layer 460 with their spin up and some will emerge with their spin down. As seen in this example, a majority of the electrons have their spin up. These majority and minority spins are depicted as spin up and spin down respectively in FIG. 4B. The spin up electrons are depicted on the left of the tunnel barrier structure 420 and the spin down electrons are depicted on the right of the tunnel barrier structure 420. As the electrons flow from the controlling structure 430 through the tunnel barrier structure 420, the electrons that have a spin that is aligned with the polarizing layer 440 of the controllable structure 410 are transmitted through the polarizing layer 440 and through the remainder of the magnetic flip-flop structure. The electrons that have a spin that is opposite to the polarizing layer 440 of the controllable structure 410 are back scattered from the polarizing layer 440 of the controllable structure 410. These back scattered electrons create a torque that flips the magnetization orientation of the layers (polarizing layer 460 and stabilizing layer 470) of the controlling structure 430, as seen by comparing the magnetization vectors $M_{460a}$ and $M_{470a}$ in FIG. 4B to the magnetization vectors $M_{460b}$ and $M_{470b}$ as seen in FIG. 4C. FIG. 4C depicts the structure after the magnetization of the controlling structure 430 has flipped but the current has not yet been altered.

FIG. 4D depicts the magnetic flip-flop structure once a second unipolar current is applied to the device. In this embodiment, the second current that is applied has an amplitude of zero, stated another way, the unipolar current is shut off. When the unipolar current is applied, the temperature of the magnetic flip-flop structure is elevated when compared with the unipolar current being off. In embodiments, the temperature of the magnetic flip-flop structure can be elevated significantly when the current is on as compared to when the current is off (or decreased). In embodiments, the temperature can be elevated by about 100° C. when the current is on, when compared to the current being off. As discussed above with respect to FIGS. 3B and 3C, there are two stable magnetic configurations of such a magnetic flip-flop structure, the stable up configuration and the stable down configuration. The magnetic flip-flop structure in FIG. 4C, once the current is shut off, is not in a stable configuration; therefore the magnetic flip-flop structure will affect a change in order to return to one of the stable configurations. The materials making up the various structures of the magnetic flip-flop structure are chosen so that the controllable structure 410 flips its magnetic orientation instead of the controlling structure 430 flipping back. As seen in FIG. 4D, the magnetization of the polarizing layer 440 and stabilizing layer 450 change from $M_{440a}$ and $M_{450a}$ to $M_{440b}$ and $M_{450b}$ respectively in order for the whole magnetic flip-flop structure to be in the stable down configuration, as shown in FIG. 4D.

The polarizing layers in the controlling structure 430 and the controllable structure 410 can be, but need not be, the same material. The materials of the polarizing layer are generally not the portion of the controlling structure 430 and the controllable structure 410 that affect the desired magnetization orientation flip. The polarizing layers are generally made of a material that will polarize electrons that flow through the material. The materials of the polarizing layers are generally chosen to create desirable spin polarization and spin torque transfer effects. In embodiments, the materials of the polarizing layers are chosen to enhance the spin polarization and spin torque transfer effects. Exemplary materials that can be utilized for polarizing layers include cobalt (Co), iron (Fe), cobalt iron alloys (CoFe), cobalt iron boron alloys (CoFeB) and combinations thereof for example. In embodiments, half metallic materials such as $CrO_2$, $Fe_3O_4$, CuMnAl and CuMnSi, for example, may also have advantageous properties.

In embodiments where both the controlling structure 430 and the controllable structure 410 include polarizing layers and stabilizing layers, the materials of the stabilizing layers are chosen so that the magnetization of the controllable structure 410 is effected to conform to the magnetization of the controlling structure 430 and not the other way around. Generally, the material(s) of the stabilizing layer of the controlling structure and the material(s) of the stabilizing layer of the controllable structure are chosen to ensure that when the unipolar current is turned off (or decreased), the controllable structure switches its magnetization in order to become parallel to the magnetization of the controlling structure; instead of the controlling structure switching its magnetization in order to become parallel to the magnetization of the controllable structure, which would simply cause the magnetic flip-flop structure to revert to its original, pre-applied unipolar current state.

The coercivity ($H_c$) of a material is the intensity of the applied magnetic field required to modify the magnetization of the material. The larger the coercivity of a material, the more difficult it is to change the magnetization of the material. The smaller the coercivity of a material, the easier it is to change the magnetization of the material. The coercivity of a material can be different at different temperatures. In general, the coercivity of the controlling structure can be lower than the coercivity of the controllable structure at operating temperatures of the magnetic flip-flop structure (current on) and the coercivity of the controllable structure is higher than the coercivity of the controlling structure at room temperature (current off or decreased).

In embodiments, materials that make up the stabilizing layer of the controlling structure and materials that make up the stabilizing layer of the controllable structure can have different coercivities at different temperatures. The coercivity at different temperatures can be important because, as discussed above, there can be a difference (in embodiments a significant difference) in the temperature of the magnetic flip-flop structure when the unipolar current is on versus off or decreased. Generally, the materials of the two stabilizing layers can be chosen so that the coercivity of the stabilizing layer of the controlling structure is smaller than the coercivity of the stabilizing layer of the controllable structure when the current is on (operating temperature, or a higher temperature) but becomes larger when the current is off or decreased (room temperature or a lower temperature). This ensures that it is the stabilizing layer of the controlling structure that switches when the current is on, but after the current is shut off or decreased, the stabilizing layer of the controlling structure is more stable and forces the stabilizing layer of the controllable structure to switch magnetic orientation. The graphs in FIGS. 5A, 5B, 5C and 5D depict properties of pairs of materials that can be utilized in the two stabilizing layers to affect this phenomenon.

Figure 5A:
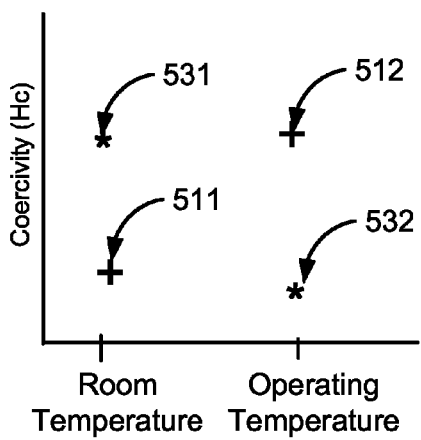
FIGS. 5A, 5B, 5C and 5D illustrate coercivity versus temperature profiles of materials that can be utilized for stabilizing layers in disclosed devices.

FIG. 5A depicts the coercivity of materials that can be used as the stabilizing layer of the controlling structure 530 and materials that can be used as the stabilizing layer of the controllable structure 510. As seen in this partial depiction of a graph of coercivity versus temperature, a material that can be used for the stabilizing layer of the controlling structure can have a first coercivity 531 at room temperature and a second coercivity 532 at the operating temperature of the magnetic flip-flop structure. Similarly, a material that can be used for the stabilizing layer of the controllable structure can have a first coercivity 511 at room temperature and a second coercivity 512 at the operating temperature of the magnetic flip-flop structure. Pairs of materials will affect the magnetization effects discussed herein when the first coercivity 531 of the controlling structure is higher than the first coercivity 511 of the controllable structure (i.e. the coercivity of the stabilizing layer of the controlling structure is higher at room temperature than the coercivity of the stabilizing layer of the controllable structure) and the second coercivity 532 of the controlling structure is lower than the second coercivity 512 of the controllable structure (i.e. the coercivity of the stabilizing layer of the controlling structure is lower at operating temperature than the coercivity of the stabilizing layer of the controlling structure). Materials that have this type of temperature dependent coercivity properties will ensure that the stabilizing layer of the controlling structure 530 will be easier to switch when the current is on (operating temperature point of the graph) because the coercivity is lower than the materials of the stabilizing layer of the controllable structure 510; and the stabilizing layer of the controllable structure 510 will be easier to switch when the current is off or decreased (room temperature point of the graph) because the coercivity is lower than the materials of the stabilizing layer of the controlling structure 530.

Figure 5B:
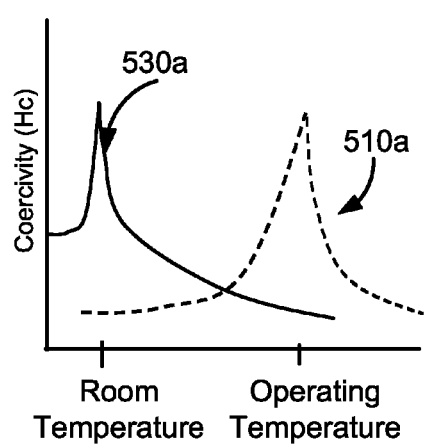

FIG. 5B depicts a larger portion of a coercivity versus temperature profile of types of materials that have the general properties exemplified by FIG. 5A. The trace labeled 530a depicts the coercivity of the stabilizing layer of the controlling structure 530 and the trace labeled 510a depicts the coercivity of the stabilizing layer of the controllable structure 510. Any pair of materials that exhibit a coercivity versus temperature profile similar to that depicted in FIG. 5B can be utilized in disclosed magnetic flip-flop structures. In embodiments, ferromagnetic materials that can be obtained by alloying rare earth metals with transition metals can be utilized. By changing the composition of the alloy, the high coercivity can be adjusted such that the stabilizing layer of the controlling structure is large at room temperature while the coercivity of the stabilizing layer of the controllable structure is large at elevated temperatures (such as operating temperatures of the device). Rare earth metals include lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm) and ytterbium (Yb). Transition metals include scandium (Sc), titanium (Ti), vanadium (V), chromium (Cr), manganese (Mn), iron (Fe), cobalt (Co), nickel (Ni), copper (Cu), zinc (Zn), yttrium (Y), zirconium (Zr), niobium (Nb), molybdenum (Mo), technetium (Tc), ruthenium (Ru), rhodium (Rh), palladium (Pd), silver (Ag), cadmium (Cd), lutetium (Lu), hafnium (Hf), tantalum (Ta), tungsten (W), rhenium (Re), osmium (Os), iridium (Ir), platinum (Pt), gold (Au), mercury (Hg) and lawrencium (Lr). In embodiments, pairs of materials that can include for example, alloys of gadolinium (Gd), alloys of terbium (Tb), alloys of dysprosium (Dy), alloys of cobalt (Co) and alloys of samarium (Sm) can be utilized for example. In embodiments, pairs of materials that can include for example, alloys of gadolinium (Gd) and iron (Fe), alloys of terbium (Tb) and iron (Fe), alloys of dysprosium (Dy) and iron (Fe) can be utilized for example. In embodiments, pairs of materials can be chosen from GdFe alloys, TbFe alloys and DyFe alloys for example. Specific exemplary pairs of materials include $Gd_{23}Fe_{77}$ and $Gd_{24}Fe_{76}$; $Tb_{19}Fe_{81}$ and $Tb_{21}Fe_{79}$; and $Dy_{17}Fe_{83}$ and $Dy_{21}Fe_{79}$.

Figure 5C:
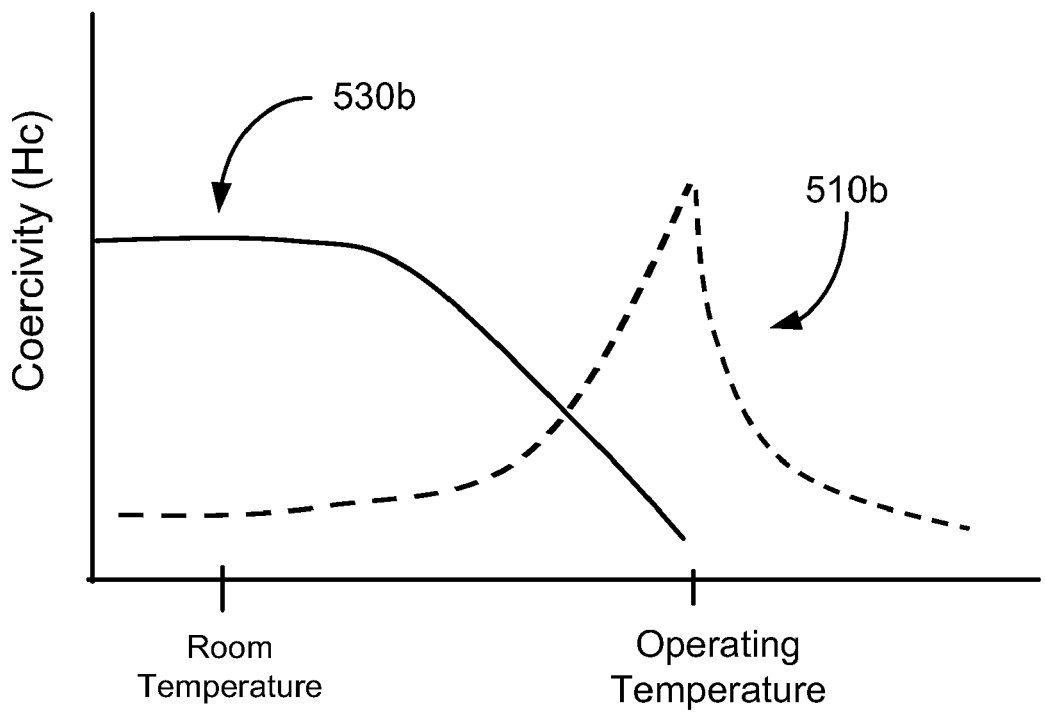

FIG. 5C depicts another coercivity versus temperature profile of types of materials that have the general properties exemplified by FIG. 5A. The trace labeled 530b depicts the coercivity of the stabilizing layer of the controlling structure 530 and the trace labeled 510b depicts the coercivity of the stabilizing layer of the controllable structure 510. Any pair of materials that exhibit a coercivity versus temperature profile similar to that depicted in FIG. 5C can be utilized in disclosed magnetic flip-flop structures. In embodiments, the stabilizing layer of the controlling structure 530 is made of a material whose perpendicular anisotropy has a relatively fast monotonic decrease such as that depicted in trace 530b. An exemplary pair of materials for the stabilizing layer of the controllable structure 510 and the controlling structure 530 include a GdTbCoFe material and a TbCoFe material respectively.

Figure 5D:
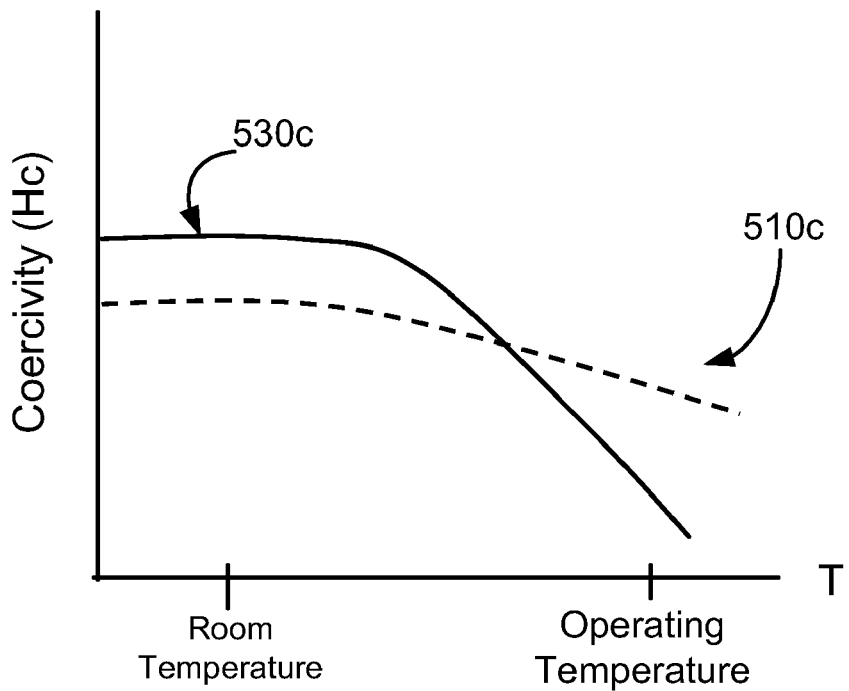

FIG. 5D shows another possible coercivity versus temperature profile of types of materials that can be utilized. In such an embodiment the coercivity 530c of the stabilizing layer of the controlling structure is higher than the coercivity 510c of the stabilizing layer of the controllable structure at room temperature and also decreases faster as temperature increases. Therefore, at operating temperature, the coercivity 510c of the stabilizing layer of the controlling structure will be higher than the coercivity 530c of the stabilizing layer of the controllable structure. Any pairs of materials that exhibit coercivity versus temperature profile similar to that depicted in FIG. 5D can be utilized in magnetic flip-flop structures. In embodiments that exhibit this type of behavior, the stabilizing layer of the controlling structure can be made of terbium cobalt iron (TbCoFe) alloys and the stabilizing layer of the controllable structure can be made of materials including cobalt chromium platinum alloys (CoCrPt), cobalt platinum alloys (CoPt), cobalt platinum multilayers (Co/Pt), cobalt nickel multilayers (Co/Ni), cobalt copper multilayers (Co/Cu) and cobalt palladium multilayers (Co/Pd) for example.

As discussed above, disclosed magnetic flip-flop structures can also have in-plane anisotropy and magnetization. A magnetic flip-flop structure that has in-plane anisotropy and magnetization will include magnetic materials that only have in-plane anisotropy and magnetization. It should be noted however that an in-plane magnetic flip-flop structure will also include non-magnetic materials (e.g. tunnel barrier structure, optional seed layer or optional cap layer). In-plane magnetic flip-flop structures are affected by stray magnetic fields. Stray magnetic fields will dictate the stable configurations of in-plane magnetic flip-flop structures. Generally, the stable configurations of in-plane magnetic flip-flop structures are anti-parallel.

Figure 6A:
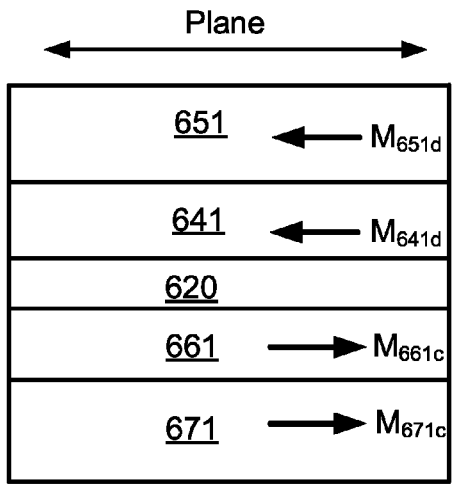
FIGS. 6A and 6B demonstrate the two stable magnetic configurations of an exemplary in-plane anisotropy and magnetization flip-flop device.
Figure 6B:
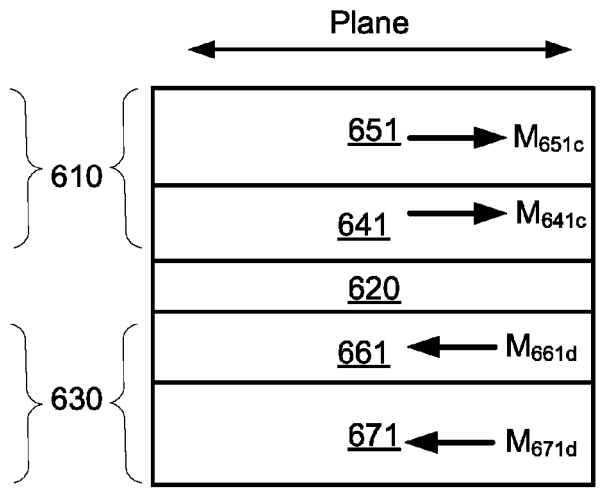

FIGS. 6A and 6B depict the two stable states of an exemplary in-plane structure. The structures depicted in these figures include controlling structures 630, tunnel barrier structures 620 and controllable structures 610 as discussed above. The magnetization plane of the structures is depicted by the arrows above the structures. There are two different magnetic configurations, one of which the structure will automatically revert to after a perturbation. The first is shown in FIG. 6A and has the magnetic moments of the controlling structure 630 anti-parallel to the magnetic moments of the controllable structure 610, referred to as "stable right-left configuration". This is depicted by the arrows depicting the magnetic moment of the stabilizing layer $M_{671c}$ and the polarizing layer $M_{661c}$ of the controlling structure 630 that both have "right" orientations; and the magnetic moment of the polarizing layer $M_{641d}$ and the stabilizing layer $M_{651d}$ of the controllable structure 610 that both have "left" orientations. The second is shown in FIG. 6B and also has the magnetic moments of the controlling structure 630 and the controllable structure 610 anti-parallel but in the opposite configuration, referred to as "stable left-right configuration". This is depicted by the arrows depicting the magnetic moment of the stabilizing layer $M_{671d}$ and the polarizing layer $M_{661d}$ of the controlling structure 630 that both have "left" orientations; and the magnetic moment of the polarizing layer $M_{641e}$ and the stabilizing layer $M_{651c}$ of the controllable structure 610 that both have "right" orientations.

Figure 7A:
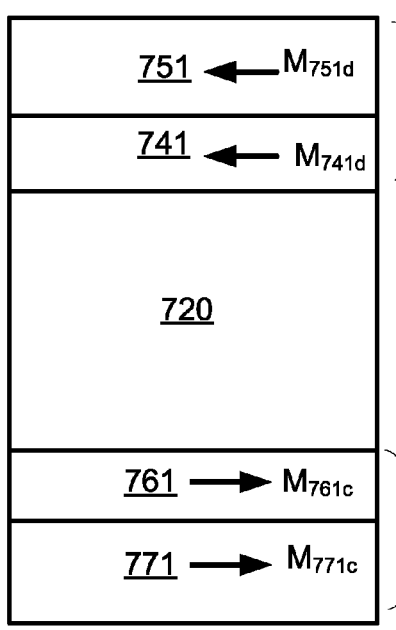
FIG. 7A depicts the exemplary device of FIG. 6A before a first current is applied thereto.

FIGS. 7A, 7B, 7C and 7D illustrate the application of unipolar current to an in-plane structure. As seen in FIG. 7A, the device includes a controlling structure 730 that includes a stabilizing layer 771 and a polarizing layer 761, a tunnel barrier structure 720 (exaggerated for easier visualization) and a controllable structure 710 that includes a polarizing layer 741 and a stabilizing layer 751. For the sake of example, the structure is depicted as being in the "stable right-left configuration", although the same principles apply to the "stable left-right configuration".

Figure 7B:
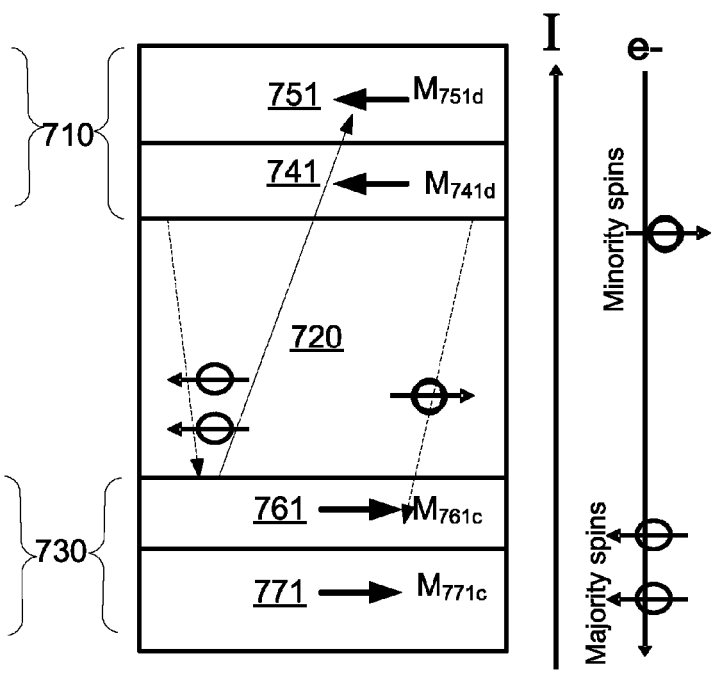
FIGS. 7B and 7C depicts the exemplary device of FIG. 6A while the first current is flowing through the device.

FIG. 7B depicts the structure once a first unipolar current is applied. As opposed to the perpendicular to the plane anisotropy and magnetization structure, the current in an in-plane anisotropy and magnetization structure is applied from the controlling structure 730 to the controllable structure 710. Therefore, unipolar current is directed from the controlling structure 730 to the controllable structure 710 as depicted by the arrow labeled "I" on the right side of the figure. This causes electrons to flow from the controllable structure 710 to the controlling structure 730, as depicted by the arrow labeled "e⁻" on the right side of the figure. The electrons that flow through the polarizing layer 741 will have both majority and minority spins. These majority and minority spins are depicted as spin left and spin right respectively. In this example, a majority of the electrons are spin left electrons. The spin left electrons are shown on the left of the tunnel barrier structure 720 and the spin right electrons are shown on the right of the tunnel barrier structure 720.

Figures 7C, 7D:
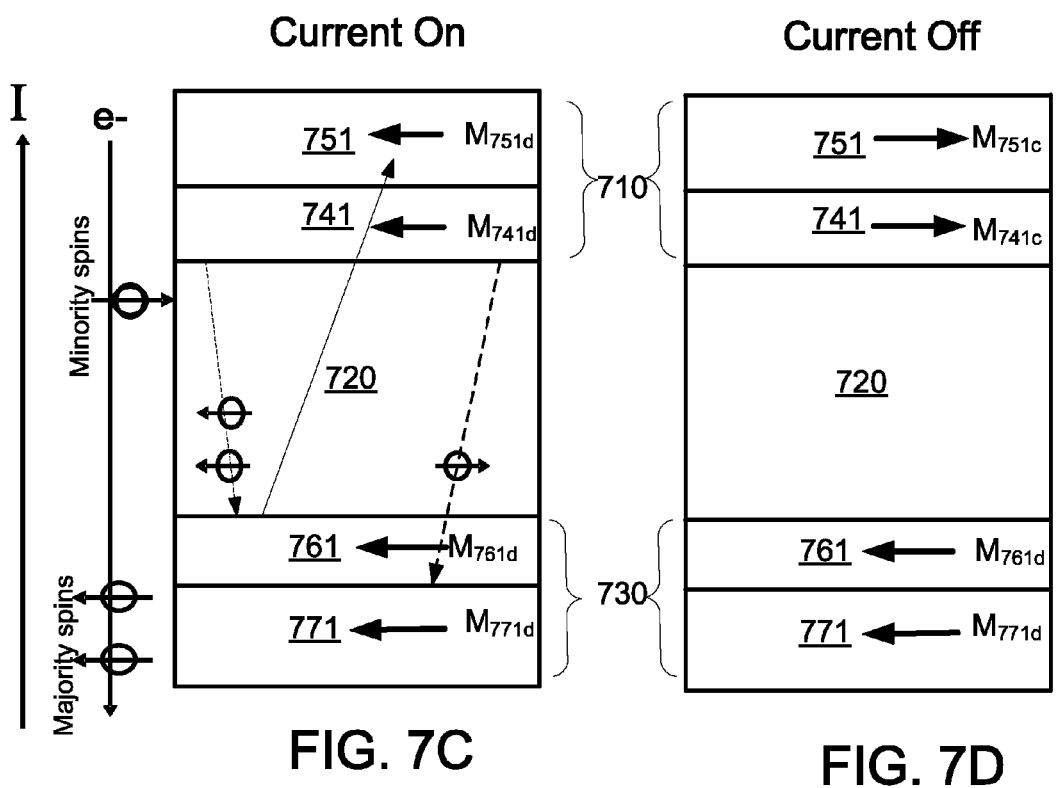
FIG. 7D depicts the exemplary device of FIG. 6A while a second current is applied thereto.

As the electrons flow from the controllable structure 710 through the tunnel barrier structure 720, the electrons that have spins that are aligned with the polarizing layer 761 of the controlling structure 730 are transmitted through the polarizing layer 761 and through the remainder of the structure (as depicted for the electrons on the right of the tunnel barrier structure 720). The electrons that have a spin that is opposite to the polarizing layer 761 of the controlling structure 730 (spin left electrons) enter the polarizing layer 761 of the controlling structure 730 and because they are opposite to the magnetization of the polarizing layer 761 create a torque that exerts a force on the magnetization of the polarizing layer 761 of the controlling structure 730. It should also be noted that some of the left spin majority electrons are back scattered from the polarizing layer 761 but because they are aligned with the magnetization of the polarizing layer 741 and the stabilizing layer 751 they do not exert a torque on the polarizing layer 741 and the stabilizing layer 751 of the controllable structure 710. The torque that is exerted on the polarizing layer 761 of the controlling structure 730 by the majority spin left electrons functions to flip the magnetization of the polarizing layer 761 and the stabilizing layer 771 of the controlling structure 730. This can be seen by comparing the magnetization vectors $M_{761c}$ and $M_{771c}$ in FIG. 7B to the magnetization vectors $M_{761d}$ and $M_{771d}$ seen in FIG. 7C. FIG. 7C depicts the device after the magnetization of the controlling structure 730 has flipped but the current has not yet been altered.

FIG. 7D depicts the structure after the unipolar current is shut off or decreased. As discussed above with respect to FIGS. 6A and 6B, there are two stable magnetic configurations, the stable left-right configuration and the stable right-left configuration. The structure in FIG. 7C, once no current is running through it is not in a stable configuration because all of the magnetic orientations are parallel; therefore the structure will affect a change in order to return to one of the stable configurations. The materials making up the structure are chosen so that the polarizing layer 741 and stabilizing layer 751 of the controllable structure 710 flips its magnetic orientation instead of the controlling structure 730 flipping its orientation and assumes the configuration shown in FIG. 7D. As seen in FIG. 7D, the magnetization of the polarizing layer 741 and stabilizing layer 751 change from $M_{741d}$ and $M_{751d}$ to $M_{741c}$ and $M_{751c}$ respectively in order for the whole structure to be in the stable left right configuration, as shown in FIG. 7D.

The materials of the polarizing layers and the pairs of stabilizing layers can be the same in in-plane anisotropy and magnetization structures as they were in perpendicular to the plane anisotropy and magnetization structures with the exception that the magnetization vectors are oriented differently (in-plane versus perpendicular to the plane).

Figure 8A:
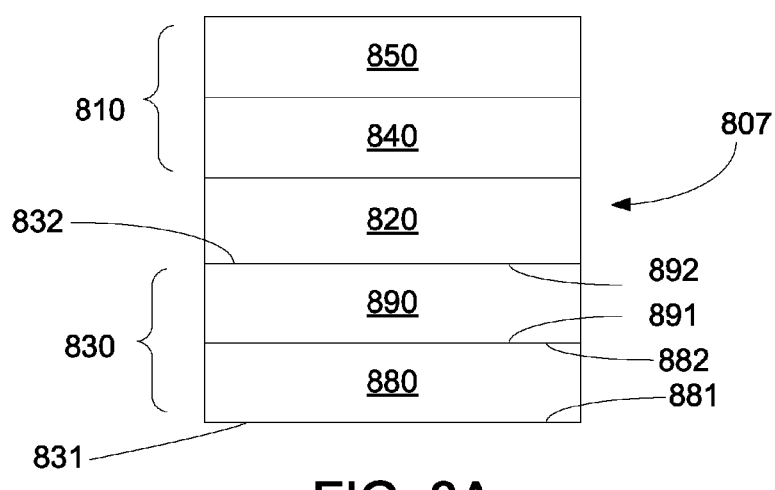
FIG. 8A is a schematic representation of a disclosed flip-flop device that includes a controlling structure having a ferromagnetic layer and an antiferromagnetic layer.

Another exemplary embodiment of a disclosed structure includes a controlling structure that does not include a stabilizing layer and polarizing layer but instead includes a ferromagnetic layer that is exchange coupled to an antiferromagnetic layer. An exemplary embodiment is depicted in FIG. 8A. The device 800 depicted in FIG. 8A includes a controllable structure 810 and a tunneling barrier structure 820 as discussed above. The controlling structure 830 in embodiments such as these includes an antiferromagnetic layer 880 and a ferromagnetic layer 890. The antiferromagnetic layer 880 has a first surface 881 and a second surface 882. The ferromagnetic layer 890 has a first surface 891 and a second surface 892. The second surface 882 of the antiferromagnetic layer 880 can be adjacent to, directly adjacent to or in contact with the first surface 891 of the ferromagnetic layer 890 (similarly, the first surface 891 of the ferromagnetic layer 890 can be adjacent to, directly adjacent to or in contact with the second surface 882 of the antiferromagnetic layer). The second surface 892 of the ferromagnetic layer 890 can be adjacent to, directly adjacent to, or in contact with the first surface of the tunneling barrier structure 820 (similarly, the first surface of the tunneling barrier structure 820 can be adjacent to, directly adjacent to, or in contact with the second surface 892 of the ferromagnetic layer 890). The first surface 831 of the controlling structure 830 can be substantially composed of the antiferromagnetic layer 880 and the second surface 832 of the controlling structure 830 can be substantially composed of the ferromagnetic layer 890.

An antiferromagnetic layer generally includes two sublattices of magnetic moments pointing in opposite directions. When a ferromagnetic layer is in contact with it, the magnetization of the ferromagnetic layer is pinned to the magnetic orientation of the antiferromagnetic layer. Examples of suitable materials for the antiferromagnetic layer include PtMn, IrMn, PtPdMn, FeMn, NiMn and others.

The ferromagnetic layer may be made of any useful ferromagnetic material such as, for example, Fe, Co or Ni and alloys thereof, such as NiFe and CoFe, and ternary alloys, such as CoFeB. Either or both of the ferromagnetic layer and antiferromagnetic layer may be either a single layer or an unbalanced synthetic antiferromagnetic (SAF) coupled structure, i.e., two ferromagnetic sublayers separated by a metallic spacer, such as Ru or Cu, with the magnetization orientations of the sublayers in opposite directions to provide a net magnetization. Either or both of the ferromagnetic layer and antiferromagnetic layer can be about 0.1 nm to about 10 nm thick, depending on the material.

Figure 8B:
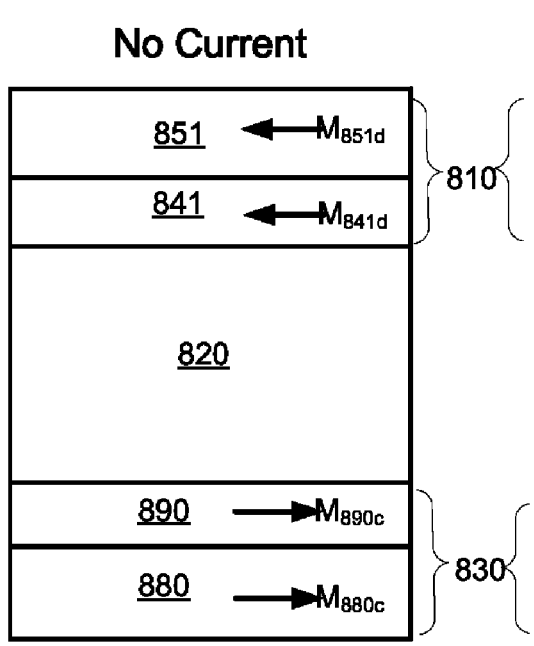
FIG. 8B depicts the exemplary device of FIG. 8A before a first current is applied thereto.

Structures such as those depicted in FIG. 8A also have two stable configurations. The first is shown in FIG. 8B and has the magnetic moments of the controlling structure 830 antiparallel to the magnetic moments of the controllable structure 810, referred to again as "stable right-left configuration". This is depicted by the arrows depicting the magnetic moment of the antiferromagnetic layer $M_{880c}$ and the ferromagnetic layer $M_{890c}$ of the controlling structure 830 that both have right orientations; and the magnetic moment of the polarizing layer $M_{841d}$ and the stabilizing layer $M_{851d}$ of the controllable structure 810 that both have left orientations. The second stable configuration (not depicted) is the opposite and is referred to as the "stable left-right configuration". In this configuration, the magnetic moment of the antiferromagnetic layer 880 and the ferromagnetic layer 890 of the controlling structure 830 would both have left orientations (as opposed to the right orientations shown in FIG. 8B); and the magnetic moment of the polarizing layer 841 and the stabilizing layer 851 of the controllable structure 810 would both have right orientations (as opposed to the left orientations shown in FIG. 8B).

Figure 8C:
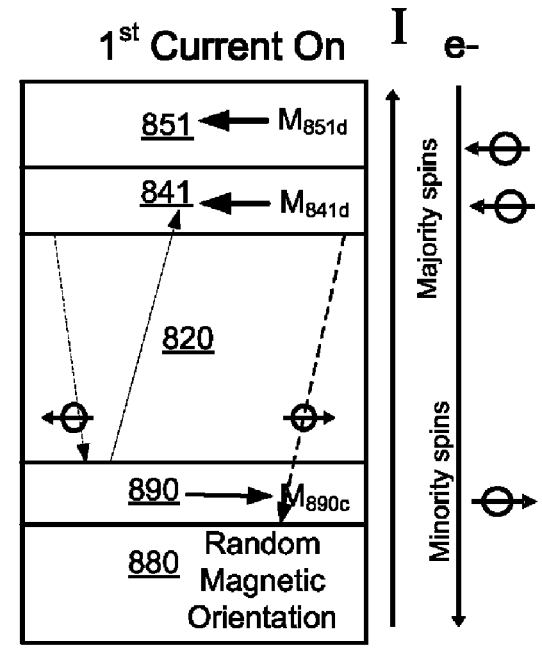
FIGS. 8C and 8D depicts the exemplary device of FIG. 8A while the first current is flowing through the device.

FIG. 8C depicts the structure of FIG. 8B once a first unipolar current is applied from the controlling structure 830 to the controllable structure 810 (as depicted by the arrow labeled I). In this example, a majority of the electrons are spin left electrons. The spin left electrons are shown on the left of the tunnel barrier structure 820 and the spin right electrons are shown on the right of the tunnel barrier structure 820. As the electrons flow from the controllable structure 810 to the controlling structure 830, the electrons that are aligned with the ferromagnetic layer 890 are transmitted through the ferromagnetic layer 890 and through the remainder of the structure. The electrons that have a spin that us opposite to the ferromagnetic layer 890 (the spin left electrons) enter the ferromagnetic layer 890 and because they are opposite create a torque that exerts a force on the ferromagnetic layer 890. It should also be noted that some of these electrons are back scattered but because they are aligned with the magnetization of the polarizing layer 841 and the stabilizing layer 851 they do not exert a torque on the controllable structure 810.

Figures 8D, 8E:
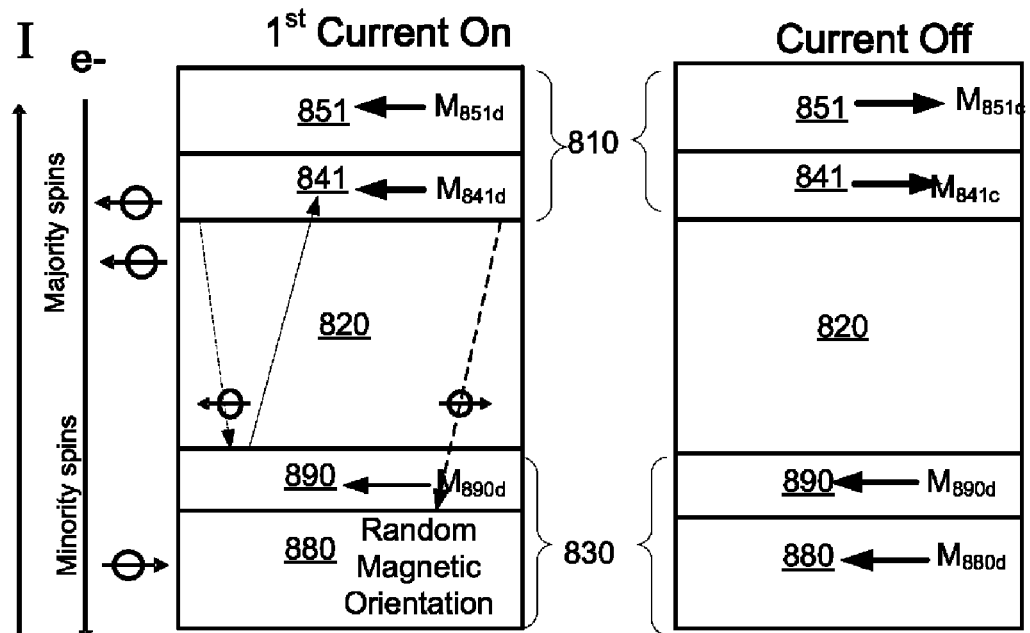
FIG. 8E depicts the exemplary device of FIG. 8A while a second current is applied thereto.

Application of a first current will also cause the antiferromagnetic layer 880 to become superparamagnetic, i.e., it will have no majority magnetic orientation and the magnetic moments of the antiferromagnetic layer 880 will become randomized. This will "unpin" the ferromagnetic layer 890, which allows its magnetic orientation to be switched by the torque from the electrons that are opposite to the magnetization of the ferromagnetic layer 890. Specifically, the opposite spin electrons that enter the ferromagnetic layer 890 of the controlling structure 830 will exert a spin torque on the ferromagnetic layer 890 and cause its orientation to be flipped from $M_{890c}$ (as shown in FIG. 8C) to $M_{890d}$ (as shown in FIG. 8D). FIG. 8D depicts the structure after the antiferromagnetic layer 880 has become superparamagnetic and the magnetization vector of the ferromagnetic layer 890 has been flipped but before the second current has been applied (i.e. a current less than the first current or a current of zero amplitude).

FIG. 8E depicts the structure once the current is turned off or decreased. The antiferromagnetic layer 880 cools down and becomes exchange coupled to the ferromagnetic layer 890 (in this example the ferromagnetic layer 890 has a left orientation $M_{890d}$ because of the influence of the spin torque of the opposite spin electrons that entered the ferromagnetic layer 890) thereby changing its magnetic orientation to a left orientation as well, see $M_{880d}$. The magnetic field from the ferromagnetic layer 890 then affects the controllable structure 810 and changes the orientation of the polarizing layer 841 and the stabilizing layer 851 to $M_{841}$ and $M_{851}$ respectively. This causes the structure to take on the stable left right configuration shown in FIG. 8E.

For the controllable structure 810 to be flipped by the controlling structure 830, the exchange field from the antiferromagnetic layer 880 must be larger than the coercivity ($H_c$) of the controllable structure 810. Such is the case when the ferromagnetic layer 890 is a material that is generally a soft magnetic material (i.e. has a low magnetic anisotropy) and the antiferromagnetic layer 880 is a material that has a relatively low blocking temperature. In embodiments, a soft magnetic material is one with an intrinsic anisotropy of less than about 100 Oersted (Oe) for example. In embodiments, a material that has a relatively low blocking temperature is one that has a blocking temperature of less than about 150° C., for example.

In embodiments such as those depicted in FIGS. 8A-8E, it may be advantageous to maintain some level of current through the structure at all times, instead of turning the current on and then turning the current off. In embodiments, a first current can be applied and then a second current can be applied, with the second current having an amplitude that is less than the first current. This may cause the temperature to drop enough that the antiferromagnetic layer 880 can reorder magnetically and once combined with the spin torque from the controllable structure 810 stabilize the ferromagnetic layer 890 during the time necessary for exchange coupling of the antiferromagnetic layer 880 to become larger than the coercivity of the controllable structure 810.

Figure 9:
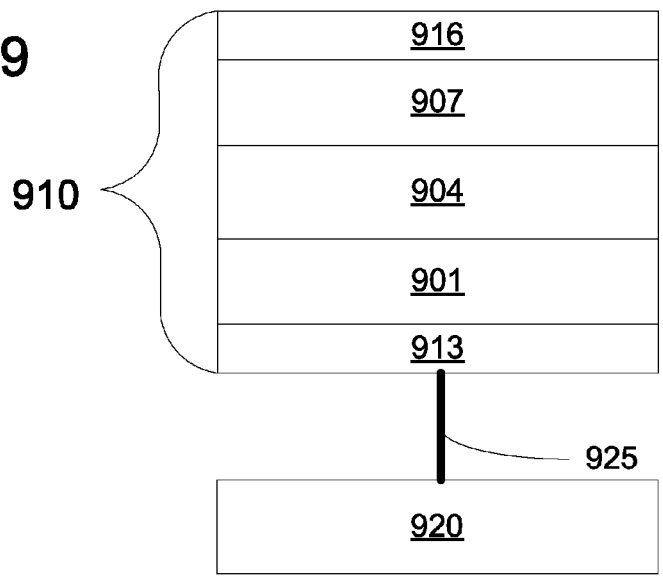
FIG. 9 is a schematic representation of a disclosed MRAM cell.

Also disclosed herein are MRAM cells. Exemplary MRAM cells include a MRAM device as discussed above and a diode. An exemplary MRAM cell is depicted in FIG. 9. The exemplary MRAM cell includes a MRAM device 910 that includes a reference layer 901, a tunnel junction 904 and a magnetic flip-flop structure 907. The MRAM device 910 can also optionally include a seed layer 913 and a cap layer 916. Seed layer 913 and cap layer 916 can optionally function as top and bottom electrodes in some embodiments. The MRAM device 910 is electrically connected, via an electrical connection 925 to a diode 920.

Diode 920 can generally be any type of diode commonly utilized. The diode 920 generally functions to control current flow into the MRAM device to which it is electrically connected. MRAM cells that include diodes instead of transistors can be advantageous because the size of a single memory cell can be decreased. Diodes are generally based on semiconductor p-n junctions. In a p-n diode, conventional current can flow from the p-type side (the anode) the n-type side (the cathode) but cannot flow in the opposite direction. In embodiments, a diode that is utilized in disclosed MRAM cells is processed at low temperatures so that the front end of the MRAM device is not detrimentally affected. In embodiments, thin film diodes based on semiconductive oxide materials may be utilized.

Disclosed MRAM cells have two stable magnetic configurations that exhibit two distinct resistance states. When a unipolar current is directed through a disclosed MRAM cell, the magnetic orientation of the controllable structure in the MRAM device is flipped. A MRAM device will have a different resistance to an electrical current based on the magnetic orientation of the controllable structure. A MRAM device that has a controllable structure with a magnetic orientation that is parallel to the reference layer will have a lower resistance than a MRAM device that has a controllable structure with a magnetic orientation that is anti-parallel to the reference layer. A read current can be utilized to determine the resistance state of the MRAM device. A read current generally has an amplitude that is insufficient to flip the magnetization orientation of the controllable structure. In embodiments, the low resistance state may be the "0" data state and the high resistance state the "1" data state, whereas in other embodiments, the low resistance state may be "1" and the high resistance state "0".

Figure 10:
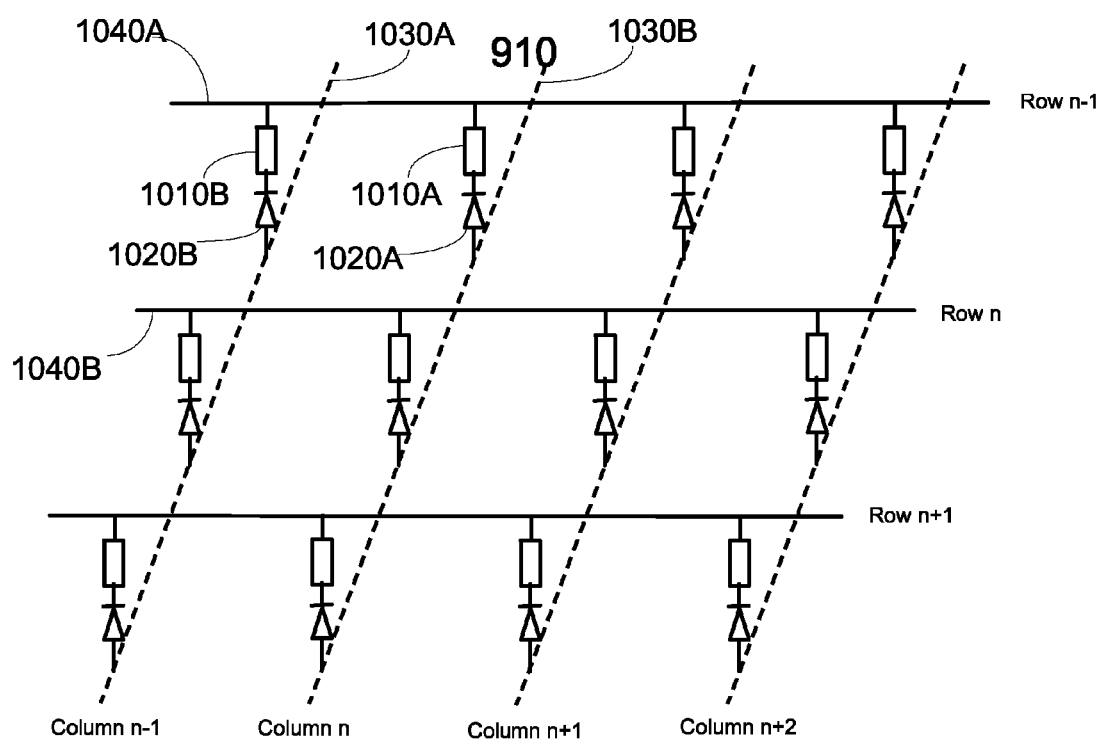
FIG. 10 is a schematic representation of an exemplary array of MRAM cells.

FIG. 10 depicts an exemplary array of MRAM cells. Each MRAM cell includes a MRAM device 1010A and 1010B for example; and a diode 1020A and 1020B for example. Individual MRAM cells are electrically connected to each other through rows, for example Row n−1 1040A and Row n 1040B; and columns, for example Column n−1 1030A and Column n 1030B for example. The MRAM cells generally have current that enters through the diode and exits through the MRAM device. The MRAM cells are electrically connected via the MRAM devices by the rows and electrically connected via the diodes by the columns, as seen in FIG. 10. The rows (for example 1040A and 1040B) are generally orthogonal to the columns (for example 1030A and 1030B). The rows and columns form a cross-point array where a memory cell (e.g. MRAM device 1010B and diode 1020B) is disposed at each cross-point.

Figure 11:
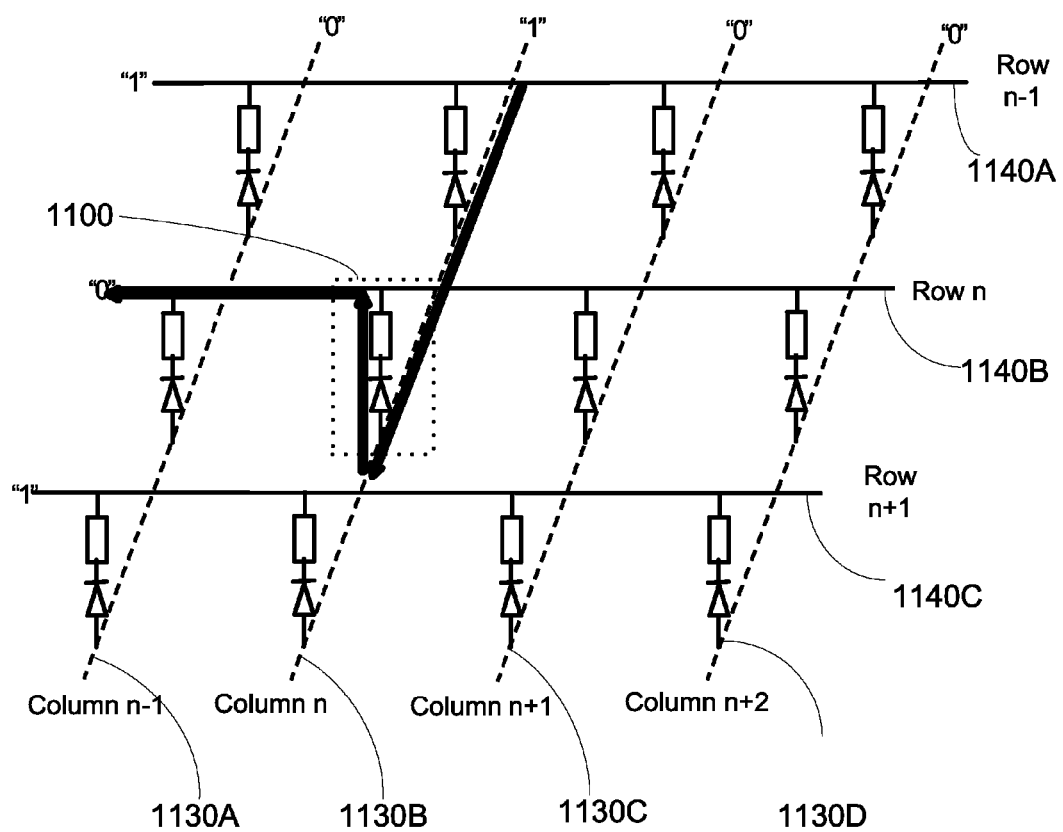
FIG. 11 is a representation schematically depicting an exemplary configuration for creating a three-dimensional structure of arrays including MRAM cells.

In using such an array, a transistor can be utilized to select the particular row and column that crosses the particular memory cell of interest. As exemplified in FIG. 11, in order to address the memory cell 1100, which is in Row n 1140B and Column n 1130B, Column n 1130B is put at a high potential ("1") and Row n 1140B at a low potential ("0"). At the same time, the rest of the rows (in this example, Row n−1 1140A and Row n+1 1140C) are set at a high potential ("1") and the rest of the columns (in this example, Column n−1 1130A, Column n+1 1130C and Column n+2 1130D) are set at a low potential ("0"). This will ensure that only the diode of memory cell 1100 is biased in the forward direction and current flows through its memory element; and all of the other diodes are reverse-biased and there will be no current flowing through them.

Figure 12:
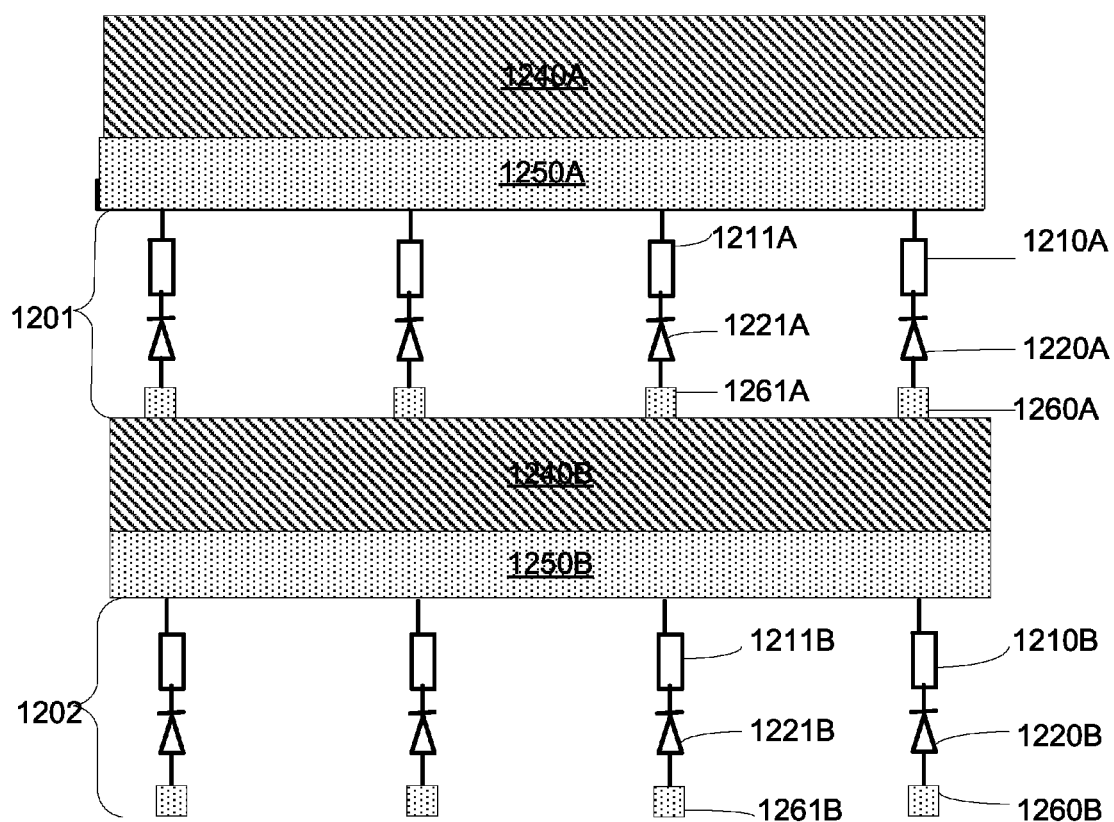
FIG. 12 is a schematic representation depicting a method of affecting a MRAM cell within an exemplary array of MRAM cells.

Arrays of MRAM cells disclosed herein can also be configured with one or more other arrays of MRAM cells as disclosed herein. In embodiments, an array as disclosed herein can be configured with at least one other array into a three dimensional structure. FIG. 12 demonstrates an exemplary way in which one array of MRAM cells can be configured with at least one other array in a three dimensional structure. MRAM cells along a single row are depicted in FIG. 12 as cells of the first array first row 1201 (also referred to as a first MRAM device layer) and MRAM cells along a single row of the second array are depicted as cells of the second array first row 1202 (also referred to as a second MRAM device layer). In such an exemplary embodiment, the first array first row 1201 (first MRAM device layer) is separated from the second array first row 1202 (second MRAM device layer) by an insulating layer 1240B (also referred to as a second array insulator layer). A single MRAM cell can be electrically connected to its array via its row and column. For example, the MRAM cell that includes first array first MRAM device 1210A and first array first diode 1220A (which can be a part of first diode layer) can be electrically connected to the first array first row 1250A (also referred to as a first conductive row layer) and the first array first column 1260A (also referred to as a first conductive column layer). Similarly, the MRAM cell that includes second array first MRAM device 1210B (which can be a part of second MRAM device layer) and second array first diode 1220B (which can be a part of second diode layer) can be electrically connected to the second array first row 1250B (also referred to as a second conductive row layer) which can and the second array first column 1260B (also referred to as a second conductive column layer).

Figure 13:
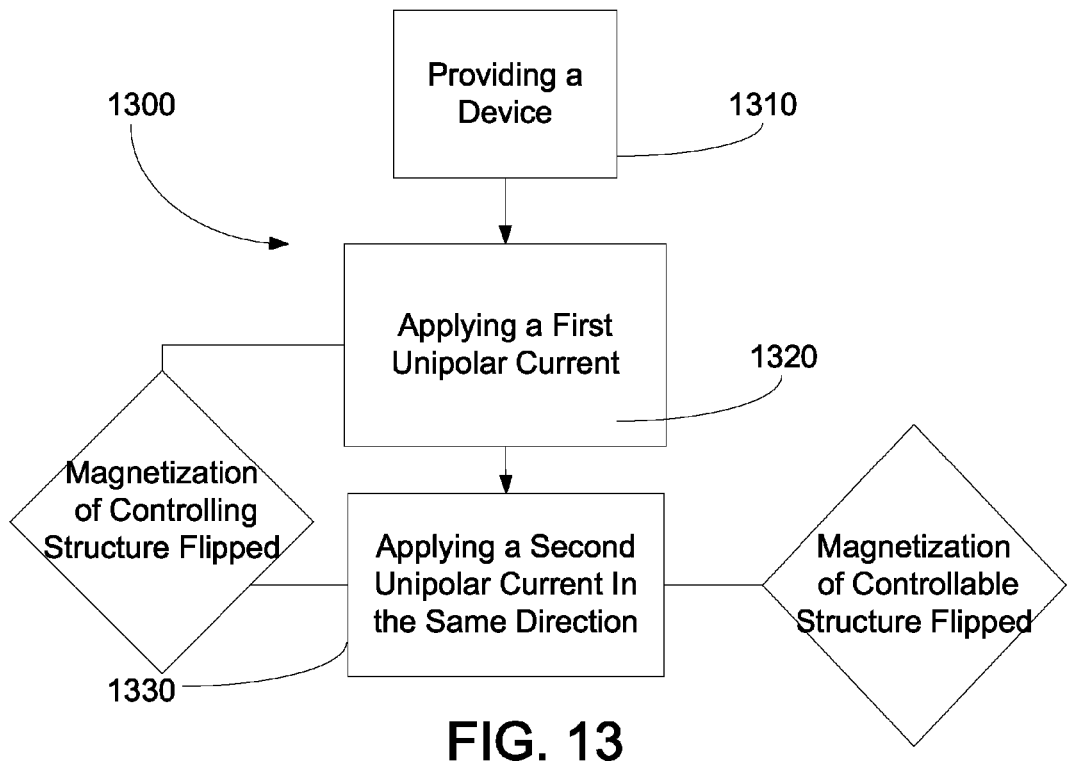
FIG. 13 illustrates an exemplary method disclosed herein.

Methods of affecting the properties of a MRAM device are also disclosed herein. In embodiments, affecting the properties of a MRAM device can also be referred to as "writing to a cell". One such exemplary method for writing to a cell is exemplified by FIG. 13. The method 1300 includes the steps of providing a device 1310, applying a first current to the device 1320 and applying a second current to the device 1330. The step of providing a device may be accomplished by manufacturing a device as disclosed herein or obtaining a pre-manufactured device as disclosed herein.

The step 1320 of applying a first current to the device may be accomplished using generally utilized electrical connections. The first current that is applied to the device is a unipolar current. The amplitude and other properties of the first current can depend at least in part on the materials that make up the device and the application for which the device will be utilized. The current can be applied to the device in one of two ways, by applying the current in a direction that has it flowing from the controlling structure to the controllable structure or by applying the current in a direction that has it flowing from the controllable structure to the controlling structure. The particular direction of current flow that will be chosen can depend on the type of device. For example, if the device is a perpendicular to the plane anisotropy and magnetization device current can be applied to flow from the controllable structure to the controlling structure of the device. If the device is an in-plane anisotropy and magnetization device current can be applied to flow from the controlling structure to the controllable structure of the device.

The step 1320 of applying a first current to the device will cause the magnetization orientation of the magnetization controlling structure to be flipped. For example, in the case of a perpendicular to the plane anisotropy and magnetization device, applying a current from the controllable structure to the controlling structure of the device will cause the magnetization orientation of the magnetization controlling structure to be flipped from up to down or down to up. In perpendicular to the plane anisotropy and magnetization devices, the flip in magnetization orientation of the controlling structure is caused by the spin torque exhibited by the minority electron spins. In the case of an in-plane anisotropy and magnetization device, applying a current from the controlling structure to the controllable structure of the device will cause the magnetization orientation of the magnetization controlling structure to be flipped from right to left or left to right. In in-plane anisotropy and magnetization devices, the flip in magnetization orientation of the controlling structure is caused by the spin torque exhibited by the majority electron spins.

The next step 1330 is to apply a second current to the device. The second current is applied in the same direction as the first current. The second current generally has an amplitude that is less than the first current. In embodiments, applying a second current to the device includes ceasing application of a current, i.e. there is no second current applied to the device, or the second current has an amplitude of 0 V. In embodiments, applying a second current to the device includes applying a current that has an amplitude that is less than the first current but is not zero. The step of applying the second current may be accomplished by turning off the source of current or altering the electrical connections to effectively turn off the source of current to the device, or by decreasing the amplitude of the current from the source of current or by altering the electrical connections to effectively diminish the amplitude of the current.

The step 1330 of applying a second current will cause the magnetization orientation of the magnetization controllable structure to be flipped. For example, in the case of a perpendicular to the plane anisotropy and magnetization device, applying a second current will cause the magnetization orientation of the magnetization controllable structure to be flipped from up to down or down to up. In the case of an in-plane anisotropy and magnetization device, applying a current from the controlling structure to the controllable structure of the device will cause the magnetization orientation of the magnetization controllable structure to be flipped from right to left or left to right. In both perpendicular and in-plane anisotropy and magnetization devices, the flip of the magnetization controllable structures is caused by the demagnetization field (also referred to as stray field) from the controlling structure acting on the controllable structure to obtain one of the magnetically stable configurations of the device. In perpendicular to the plane anisotropy and magnetization devices, once the magnetization orientation of the magnetization controllable structure is flipped, the magnetization orientation of the magnetization controlling structure and the magnetization orientation of the magnetization controllable structure are parallel. In an in-plane anisotropy and magnetization device, once the magnetization orientation of the magnetization controllable structure is flipped, the magnetization orientation of the magnetization controlling structure and the magnetization orientation of the magnetization controllable structure are anti-parallel.

Another exemplary method disclosed herein includes the steps of determining the resistance of the MRAM cell (also referred to as reading the MRAM cell) and the step of writing to the MRAM cell. Reading a cell can be accomplished by measuring the electrical resistance of the cell. A particular cell can be selected, as described above by setting the potentials of the rows and cells to isolate the desired cell as the only one that is biased in a forward direction. Due to the magnetic tunnel effect, the electrical resistance of the cell changes because of the magnetic orientation of the controllable structure of the MRAM device. By measuring the resulting current, the resistance inside the particular cell can be determined. In embodiments, the low resistance state may be the "0" data state and the high resistance state the "1" data state, whereas in other embodiments, the low resistance state may be "1" and the high resistance state "0".

MRAM cells as disclosed herein are generally read from before they are written to because of the nature of the step of writing. If for example, it is desired to write "1" to a particular cell. The necessary action depends on the initial contents of the MRAM cell. If the MRAM cell is already in state "1", a write current should not be applied to the cell because doing so will flip the cell to the wrong state, i.e. in this case of the "0" state. If, on the other hand, the MRAM cell was originally in state "0", then a write current should be applied because doing so will result in the MRAM cell flipping to be in the opposite "1" state.

Figure 14:
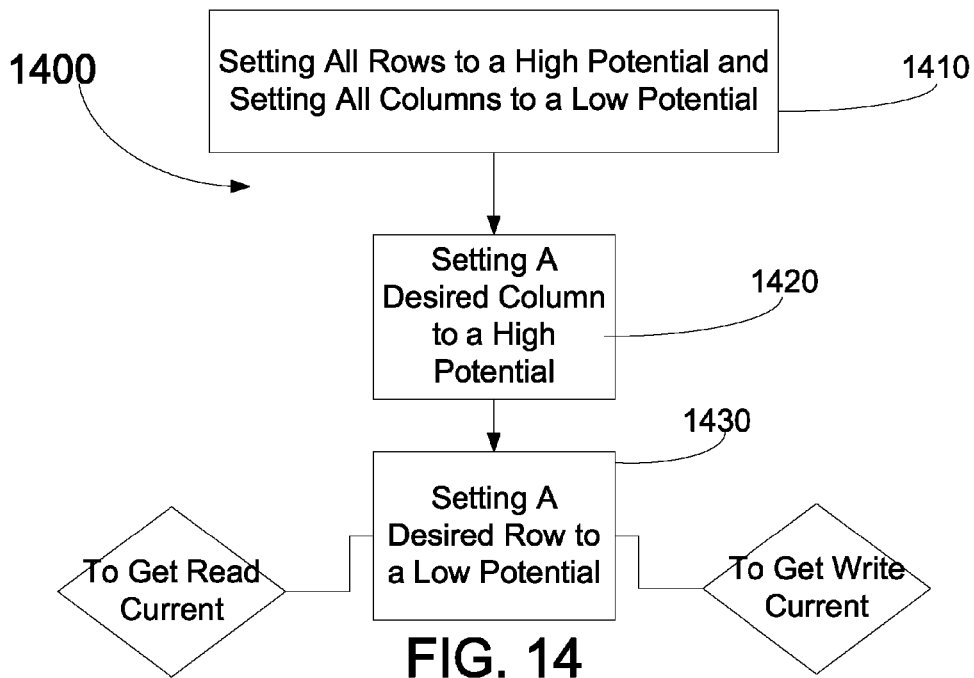
FIG. 14 illustrates an exemplary method of accessing a memory array as disclosed herein.

FIG. 14 demonstrates steps that can be utilized to read from or write to a MRAM cell that is configured within an array, such as an array exemplified by FIG. 10. It should be noted that although the steps in FIG. 14 are depicted as occurring one after another, they can also be carried out simultaneously or in any other order. The first step 1410 includes setting all rows of the memory array to a high potential and setting all columns to a low potential. It should be noted that this step can also be carried out separately, in two or more steps. This step functions to set the array so that current would only be to pass from the MRAM device to the diode, but because the diodes in the array are configured to only allow current to pass from it to the MRAM device, no current will be passing through any of the MRAM cells.

The next step 1420 includes setting a desired column to a high potential. The desired column would be the column in which the desired memory cell is found. The next step 1430 includes setting a desired row to a low potential. The desired row would be the row in which the desired memory cell is found. The combination of these three steps ensures that only the diode of the desired memory cell is biased in the forward direction and current flows only through its memory element; and all of the other diodes are reverse-biased and there will be no current flowing through them.

This method can be utilized to read from a memory cell or write to a memory cell. In embodiments, unipolar currents that can be used to write to a MRAM cell as disclosed herein can be from about 30 to about 100 microamperes, while unipolar currents that can be used to read from a MRAM cell as disclosed herein can be about ⅓ of the write current utilized. In embodiments, a write current can be about 30 to 100 microamperes and a read current can be about 10 to 35 microamperes.

Methods that include other steps not disclosed herein carried out before, after or in between the steps disclosed herein are also contemplated by the disclosure. Furthermore, the disclosed steps and others not disclosed herein can be utilized once or more than once in any combination to effect MRAM devices, cells and arrays as disclosed herein.

Thus, embodiments of MAGNETIC RANDOM ACCESS MEMORY (MRAM) DEVICES UTILIZING MAGNETIC FLIP-FLOP STRUCTURES are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present disclosure is limited only by the claims that follow.

What is claimed is:

1. An array comprising a plurality of magnetic random access memory (MRAM) cells, each MRAM cell comprising:
    a device comprising
        a magnetic flip-flop device comprising:
            a magnetization controlling structure;
            a first tunnel barrier structure; and
            a magnetization controllable structure comprising:
                a first polarizing layer; and
                a first stabilizing layer,
            wherein the first tunnel barrier structure is between the magnetization controllable structure and the magnetization controlling structure and the first polarizing layer is between the first stabilizing layer and the first tunnel barrier structure,
            wherein the first polarizing layer comprises cobalt (Co), iron (Fe), cobalt iron alloys (CoFe), cobalt iron boron alloys (CoFeB), or combinations thereof, and
            wherein the first stabilizing layer comprises alloys of gadolinium (Gd), alloys of terbium (Tb), alloys of dysprosium (Dy), alloys of cobalt (Co) and alloys of samarium (Sm);
        a reference layer; and
        a second tunnel barrier structure,
        wherein the second tunnel barrier structure is between the magnetic flip-flop device and the reference layer; and
    a diode electrically coupled to the MRAM device,
    wherein the plurality of MRAM devices are connected to each other in an array.

2. The array according to claim 1, wherein the array comprises select transistors used to select entire rows or columns of the array and not individual MRAM cells.

3. The array according to claim 1, wherein the array is configured in a three dimensional structure with a plurality of other arrays comprising magnetic random access memory cells.

4. The array according to claim 1, wherein the first stabilizing layer is chosen from the group consisting of: GgTbCoFe and TbCoFe.

5. The array according to claim 1, wherein the first stabilizing layer is chosen from the group consisting of: CoCrPt, CoPt, Co/Pt Co/Ni, Co/Cu and Co/Pd; and the second stabilizing layer comprises TbCoFe.

6. The array according to claim 1, wherein the first polarizing layer is chosen from the group consisting of: $CrO_2$, $Fe_3O_4$, CuMnAl, and CuMnSi.

7. The array according to claim 1, wherein the magnetization controlling structure comprises a second polarizing layer and a second stabilizing layer.

8. The array according to claim 7, wherein second polarizing layer comprises cobalt (Co), iron (Fe), cobalt iron alloys (CoFe), cobalt iron boron alloys (CoFeB), or combinations thereof, and the second stabilizing layer comprises alloys of gadolinium (Gd), alloys of terbium (Tb), alloys of dysprosium (Dy), alloys of cobalt (Co) and alloys of samarium (Sm).

9. The array according to claim 7, wherein the first and second stabilizing layers are independently chosen from the group consisting of: GgTbCoFe and TbCoFe.

10. The array according to claim 7, wherein the first stabilizing layer is chosen from the group consisting of: CoCrPt, CoPt, Co/Pt Co/Ni, Co/Cu and Co/Pd; and the second stabilizing layer comprises TbCoFe.

11. The array according to claim 7, wherein the first and second polarizing layers are independently chosen from the group consisting of: cobalt (Co), cobalt iron alloys (CoFe), cobalt iron boron alloys (CoFeB), and combinations thereof 12. The array according to claim 7, wherein the first and second polarizing layers are independently chosen from the group consisting of: $CrO_2$, $Fe_3O_4$, CuMnAl, and CuMnSi.

13. The array according to claim 1, wherein the magnetization controlling structure comprises an antiferromagnetic layer and a ferromagnetic layer exchange coupled to the antiferromagnetic layer.

14. The array according to claim 1, wherein the array further comprises select transistors used to select entire rows or columns of the array and not individual MRAM cells.

15. The array according to claim 1, wherein the MRAM cells are spin torque devices.

16. An array comprising a plurality of magnetic random access memory (MRAM) cells, each MRAM cell comprising:

a device comprising
   a magnetic flip-flop device comprising:
      a magnetization controlling structure;
      a first tunnel barrier structure; and
      a magnetization controllable structure comprising:
         a first polarizing layer; and
         a first stabilizing layer,
      wherein the first tunnel barrier structure is between the magnetization controllable structure and the magnetization controlling structure and the first polarizing layer is between the first stabilizing layer and the first tunnel barrier structure,
      wherein the first polarizing layer comprises cobalt (Co), iron (Fe), cobalt iron alloys (CoFe), cobalt iron boron alloys (CoFeB), or combinations thereof, and
      wherein the first stabilizing layer comprises alloys of gadolinium (Gd), alloys of terbium (Tb), alloys of dysprosium (Dy), alloys of cobalt (Co) and alloys of samarium (Sm);
   a reference layer; and
   a second tunnel barrier structure,
   wherein the second tunnel barrier structure is between the magnetic flip-flop device and the reference layer;
   a diode electrically coupled to the MRAM device;
   a first conductive element electrically coupled to the diode; and
   a second conductive element electrically coupled to the magnetic flip flop device,
wherein the plurality of MRAM devices are connected to each other in an array.

17. The array according to claim 16, wherein the magnetization controlling structure comprises a second polarizing layer and a second stabilizing layer.

18. The array according to claim 17, wherein the first and second stabilizing layers are independently chosen from the group consisting of: alloys of gadolinium (Gd), alloys of terbium (Tb), alloys of dysprosium (Dy), alloys of cobalt (Co) and alloys of samarium (Sm).

19. The array according to claim 16, wherein the magnetization controlling structure comprises an antiferromagnetic layer and a ferromagnetic layer exchange coupled to the antiferromagnetic layer.

20. The array according to claim 16, wherein the MRAM cells are spin torque devices.

21. A method of accessing a memory array comprising:
   providing an array of unipolar MRAM cells, each cell serially connected to a diode, configured in rows and columns with row conductors and column conductors;
   setting all row conductors to a high potential and setting all column conductors to a low potential;
   accessing a desired MRAM cell by setting a corresponding desired column conductor to a high potential and setting a corresponding desired row conductor to a low potential; and
   passing at least one unipolar current to the desired MRAM cell.

22. The method according to claim 21, wherein the unipolar current is selected from: a write current between about 30 and 100 microamperes; a read current between about 10 and 35 microamperes to the desired MRAM cell; and combinations thereof.

* * * * *